United States Patent [19]
Furutani et al.

[11] Patent Number: 5,796,287
[45] Date of Patent: Aug. 18, 1998

[54] OUTPUT DRIVER CIRCUIT FOR SUPPRESSING NOISE GENERATION AND INTEGRATED CIRCUIT DEVICE FOR BURN-IN TEST

[75] Inventors: Kiyohiro Furutani; Hideyuki Ozaki, both of Hyogo, Japan

[73] Assignee: Mitsubishi Denki Kabushiki Kaisha, Tokyo, Japan

[21] Appl. No.: 145,710

[22] Filed: Nov. 4, 1993

[30] Foreign Application Priority Data

Nov. 4, 1992 [JP] Japan .................................. 4-294993

[51] Int. Cl.$^6$ ................................................ H03K 17/04
[52] U.S. Cl. ........................ 327/374; 327/170; 327/389
[58] Field of Search ............................. 307/263, 443, 307/572, 573, 574, 575, 576, 577, 579, 581, 584, 585; 327/170, 379, 384, 387, 389, 437, 108, 374

[56] References Cited

U.S. PATENT DOCUMENTS

| | | | |
|---|---|---|---|
| 4,961,010 | 10/1990 | Davis | 307/443 |
| 5,003,205 | 3/1991 | Kohda et al. | 307/443 |
| 5,041,738 | 8/1991 | Walters | 327/170 |
| 5,128,555 | 7/1992 | Millman . | |

FOREIGN PATENT DOCUMENTS

| | | |
|---|---|---|
| 3632862 | 4/1987 | Germany . |
| 3-214669 | 9/1991 | Japan . |

OTHER PUBLICATIONS

"Dual-Regulator Dual-Decoding-Trimmer DRAM Voltage Limiter for Burn-in Test", Masashi Horiguchi et al., *IEEE Journal of Solid-State Circuits*, vol. 26, No. 11, Nov. 1991, pp. 1544–1549.

R.C. Foss et al., "Application of a High-Voltage Pumped Supply for Low-Power DRAM", 1992 Symposium on VLSI Circuits Digest of Technical Papers.

*Primary Examiner*—Timothy P. Callahan
*Assistant Examiner*—Jung Ho Kim
*Attorney, Agent, or Firm*—Lowe, Price, LeBlanc & Becker

[57] ABSTRACT

An improved output driver circuit for a semiconductor integrated circuit device is provided. The output driver circuit receives a type select signal ($\phi 1/\phi 1$) determined by bonding selection. When a heavy load circuit is connected to an output terminal (DQ), a signal ($\phi 1$) of low level and a signal (/$\phi 1$) of high level are provided, whereby transistors (18, 19) are turned on simultaneously in response to a data signal (Mo). When a light load circuit is connected to the terminal (DQ), a signal ($\phi 1$) of high level and a signal (/$\phi 1$) of low level are provided, whereby transistors (18, 19) are turned on at a different timing. More specifically, following charging of a light load by a transistor (18) having low mutual conductance, a transistor (19) is turned on. Therefore, noise generation can be flexibly suppressed by bonding selection.

11 Claims, 24 Drawing Sheets

OUTPUT DRIVER CIRCUIT FOR SUPPRESSING NOISE GENERATION AND INTEGRATED CIRCUIT DEVICE FOR BURN-IN TEST

CROSS-REFERENCE TO RELATED, COPENDING APPLICATION

Related, copending application of particular interest to the instant application is U.S. Ser. No. 08/043,697 entitled "Improved Output Driver Circuit for Restraining Generation of Noise and Semiconductor Memory Device Utilizing Such Circuit", filed Apr. 8, 1993 and assigned to the same assignee of the instant application.

BACKGROUND OF THE INVENTION

1. Field of the Invention

The present invention relates to output driver circuits for semiconductor integrated circuit devices, and more particularly, to an output driver circuit allowing suppression of noise generation. The present invention also relates to a semiconductor integrated circuit device improved for burn-in testing. The present invention has particular applicability to a semiconductor memory device.

2. Description of the Background Art

In general, a plurality of semiconductor integrated circuit devices are mounted on a printed circuit board. The input and output terminals thereof are connected to each other via a wiring provided on the printed circuit board. When an output signal is provided from a semiconductor integrated circuit device, a wiring and another semiconductor integrated circuit device, i.e. load connected to that output terminal (or output lead) are driven by the output signal.

At the output stage of a semiconductor integrated circuit device, an output driver circuit is provided for driving the load connected to an output terminal. A large capacitance load or a small capacitance load may be connected to the same output driver depending on the applications. The transistor of the final stage of an output driver circuit generally has a large mutual conductance (or current driving capability) so as to drive the large capacitance load quickly.

The present invention is generally applicable to an output driver circuit provided at an output stage of a semiconductor integrated circuit device. In the following, an application to a dynamic random access memory (referred to as "DRAM" hereinafter) will be described.

FIG. 25 is a circuit diagram of a conventional output buffer circuit (or an output driver circuit). An output buffer circuit 330 shown in FIG. 25 is disclosed in Japanese Patent Laying-Open No. 3-214669. Referring to FIG. 25, output buffer circuit 330 includes NMOS transistors 1, 2, 3 and 4 for driving a load 331 via an output terminal DQ, NAND gates 5 and 6, NOR gates 7, 8, 9 and 10, inverters 11 and 12, and resistors 13a, 13b, 14a and 14b.

NAND gates 5 and 6 and inverters 11 and 12 have an internal power supply voltage $V_{CCI}$ of 3.3 V supplied from a voltage down converter not shown. NOR gates 7, 8, 9 and 10, and other circuits are applied with a power supply voltage $V_{CCE}$ of 5 V. Therefore, each of NOR gates 7–10 have a level conversion function.

NAND gate 5 receives an enable signal $\phi_{MA}$ and a data signal Mo. NAND gate 6 receives an enable signal $\phi_{MA}$ and an inverted data signal /Mo.

FIG. 26 is a timing chart for describing the operation of output buffer circuit 330 of FIG. 25. Referring to FIGS. 25 and 26, data signals Mo and /Mo are provided at time t1 (FIG. 26(a)). At time t2, an enable signal $\phi_{MA}$ rises (FIG. 26(b)). Therefore, output buffer circuit 330 is enabled in response to a signal $\phi_{MA}$.

At time t3 after the rise of a signal $\phi_{MA}$, gate voltage V1 of transistor 1 rises (FIG. 26(c)). The gate voltage V2 of transistor 2 is maintained at low level. Gate voltage V3 of transistor 3 responds to the rise of a signal $\phi_{MA}$ to rise at time t4 (FIG. 26(d)). The gate voltage V4 of transistor 4 is maintained at low level.

The difference in the rising timings of gate voltages V1 and V3 is determined by the difference in the resistances of delay resistors 14a and 13a. More specifically, the resistance of resistors 14a and 13a are determined so that the gate voltage V3 is delayed by approximately 1nsec from the rise of the gate voltage V1. Therefore, in response to the rise of gate voltage V1, transistor 1 conducts at time t3. Transistor 3 responds to the rise of gate voltage V3 to conduct at time t4.

Transistor 1 has a channel width smaller than that of transistor 3. Therefore, the mutual conductance gal of transistor 1 is smaller than the mutual conductance gem of transistor 3. Transistor 2 has a channel width narrower smaller than that of transistor 4. Therefore, the mutual conductance gm2 of transistor 2 is smaller than the mutual conductance gm4 of transistor 4.

In general, output terminal DQ has load 331 connected equivalently as shown in FIG. 25. Referring to FIG. 25, an inductance component 104 and a capacitance component 105 are shown as equivalent load 331. Inductance component 104 and capacitance component 105 are induced by input/output terminals (or input/output leads), a bonding wire, a wiring formed on a printed circuit board, and other semiconductor integrated circuit devices directly connected to output terminal DQ.

Semiconductor integrated circuit devices such as semiconductor memories are used for various applications in various electronic equipments. This means that output terminal DQ has various semiconductor integrated circuit devices connected thereto. Therefore, output buffer circuit 330 shown in FIG. 25 has problems set forth in the following according to the size of the load capacitance connected to output terminal DQ.

Referring to FIG. 26(e), when the load capacitance component 105 is small, the small transistor 1 thoroughly charges the load capacitance component 105 before the large transistor 3 conducts at time t4. Therefore, a moderate rise time of output voltage DQ can be obtained at FIG. 26(e).

Here, if resistors 13a and 14a of FIG. 25 have the same resistance, the gate voltage V3' of transistor 3 rises at time t3 as shown by a chain dotted line in FIG. 26(d). In other words, transistors 1 and 3 conduct simultaneously. This means that the small load capacitance component 105 is charged by the two transistors 1 and 3 so fast as to cause ringing as shown in FIG. 26(f). More specifically, electromotive force L·di/dt is generated in inductance component 104, whereby ringing is induced in a resonation circuit formed by inductance component 104 and capacitance component 105. Because the amplitude of this ringing is increased as the electromotive force L·di/dt becomes higher, a noise of a high level is generated by the simultaneous conduction of the two transistors 1 and 3.

When the capacitance component 105 of the load is small, it is necessary to set resistors 13a and 14a so that transistors 1 and 3 conduct at different timing. However, when capacitance component 105 of the load is large, such a setting will induce a problem as shown in FIG. 26(g).

When capacitance component 105 of the load is great, the charging of capacitance component 105 is initiated by conductance of transistor 1. However, because transistor 1 has a small mutual conductance gm1, capacitance component 105 can not be charged sufficiently just by the conduction of transistor 1. Therefore, capacitance component 105 will be thoroughly charged after conduction of transistor 3 at time t4. As a result, the rise of output voltage DQ is delayed as shown in FIG. 26(g).

When capacitance component 105 of the load is high, it is necessary to set resistors 13a and 14a to have the same resistance to obtain simultaneous conduction of transistors 1 and 3. This allows a fast rise of output voltage DQ as shown in FIG. 26(e) even if capacitance component 105 of the load is large.

From the foregoing, it is appreciated that resistors 13a, 14a (and 13b, 14b) having different resistances must be used according to the level of the capacitance component of the load in a semiconductor integrated circuit device in order to suppress generation of noise such as ringing. To satisfy this requirement, the semiconductor manufacturer must provide a semiconductor integrated circuit device having a resistance differing only in the output buffer circuit with the same circuit configuration. This means that two production lines are required for the manufacture of similar products, resulting in increase of the manufacturing cost.

Next, we move on to a problem concerning high voltage generating circuits which drive output drivers. A conventional integrated circuit device having a plurality of output buffer circuits is supplied with one high voltage generating circuit for providing high voltage to output buffer circuits. A level clamp circuit is used to limit the level of high voltage. An output buffer consumes high voltage only when it outputs "H" data. If the high voltage generating circuit is designed so that all the output buffer circuits simultaneously provide data "H", large amount of high voltage charge will be wasted by the level clamp circuit when all the output buffer circuits output data "L". In order to save operating power, we differentiate the power supplying capability of the high voltage generating circuit according to the number of output data "H".

Finally we describe a problem which arises during burn-in test. Usually, we let semiconductor integrated circuits operate at high supply voltage under high temperature to screen defective devices out of manufactured devices before shipment. This procedure is called burn-in test. However, a conventional semiconductor integrated circuit device with a high voltage generating circuit has its internal circuit easily damaged due to excessive high voltage generation when burn-in testing is carried out. Therefore, a high voltage having a desired high level could not be supplied as power supply voltage $V_{cc}$ during burn-in testing. Therefore, a desired burn-in testing could not be carried out.

SUMMARY OF THE INVENTION

An object of the present invention is to prevent noise from being generated from an output driver circuit by adding a simple step to a manufacturing process thereof.

Another object of the present invention is to prevent noise from being generated from a semiconductor integrated circuit device by adding a simple step to the manufacturing process thereof.

A further object of the present invention is to prevent noise from being generated from a semiconductor memory device by adding a simple step to the manufacturing process thereof.

Still another object of the present invention is to optimize power consumption by an output driver circuit requiring supply of high voltage.

A still further object of the present invention is to prevent an internal circuit from being damaged by execution of a burn-in test in a semiconductor integrated circuit device.

According to an aspect of the present invention, an output driver circuit includes a predetermined node formed in a semiconductor substrate, a current providing circuit responsive to a supplied data signal defining output data for providing output current via a data output terminal, and a current increasing rate control circuit responsive to a potential at the predetermined node for controlling the increasing rate of an output current of the current providing circuit.

In operation, the current increasing rate control circuit responds to a potential at a predetermined node in a substrate for controlling the increasing rate of an output current by the current providing circuit. Therefore, the increasing rate of an output current can easily be controlled by providing potential to a predetermined node. As a result, generation of noise can be suppressed.

According to another aspect of the present invention, an output driver circuit includes a plurality of field effect transistors, each connected between a corresponding one of a plurality of data output terminals and an externally applied power supply potential, and a plurality of high voltage applying circuit, each receiving a power supply potential and responsive to a data signal defining a corresponding one of the plurality of output data for applying a higher voltage exceeding the power supply potential to a corresponding gate electrode of the plurality of field effect transistors.

In operation, each high voltage applying circuit responds to a corresponding data signal for applying a high voltage to the gate electrode of a corresponding field effect transistor. Therefore, an output driver circuit of lower power consumption can be obtained without increase of the wiring area.

According to a further aspect of the present invention, a semiconductor integrated circuit device includes a high voltage applying circuit for receiving an externally applied power supply voltage and applying a high voltage exceeding the power supply voltage to an internal circuit, a burn-in test mode detecting circuit responsive to an externally applied power supply voltage for detecting a specification of a burn-in test mode, and a level reducing circuit responsive to the burn-in test mode detecting circuit for reducing the level of the high voltage provided from the high voltage applying circuit.

In operation, the level reducing circuit reduces the level of the high voltage provided from the high voltage applying circuit in a burn-in test mode. This prevents the internal circuit from being damaged by the high voltage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The present invention will be described hereinafter applied to a DRAM.

Figure 1:
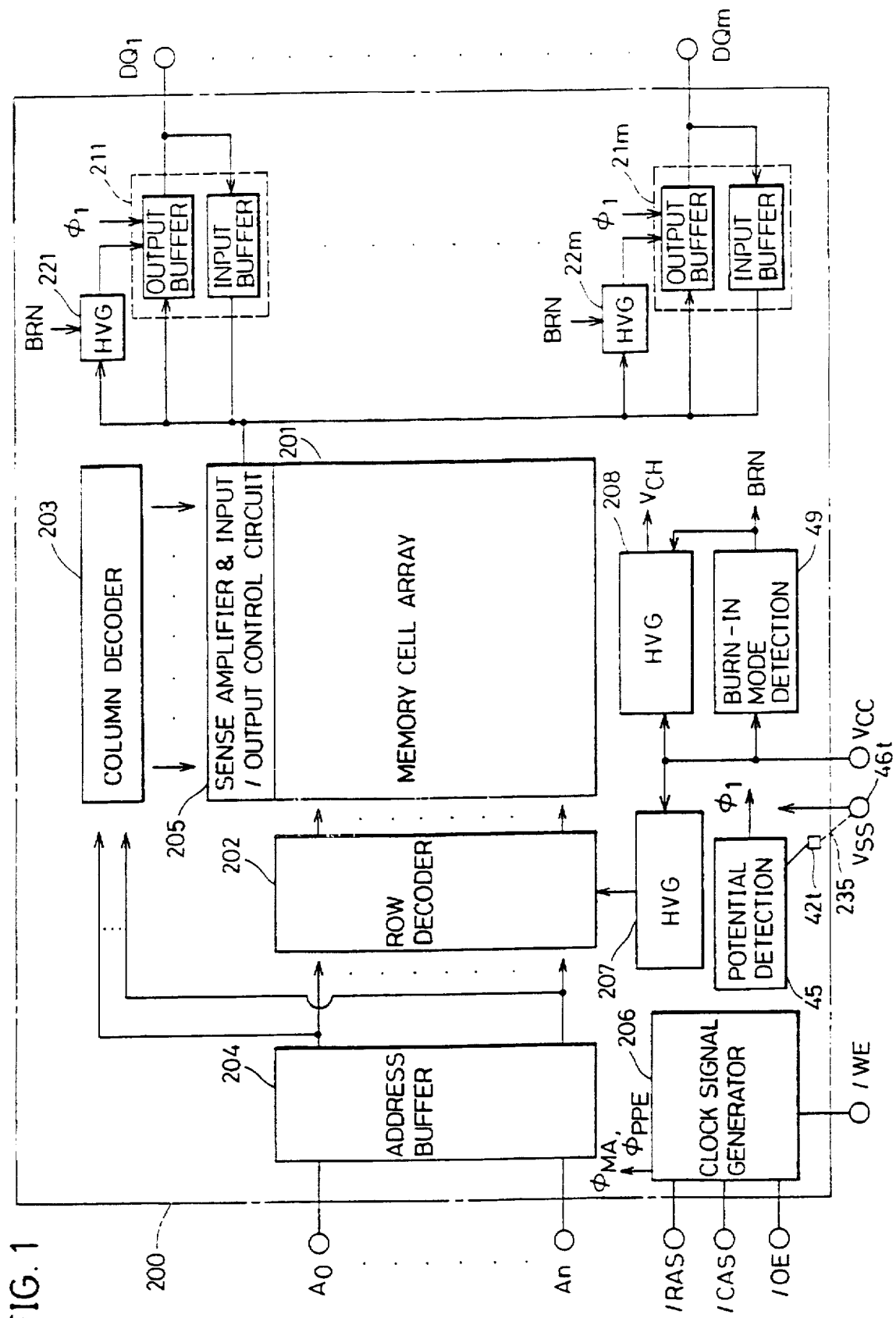
FIG. 1 is a circuit diagram of a DRAM showing an embodiment of the present invention.

Referring to FIG. 1, a DRAM 200 includes a memory cell array 201 having a plurality of memory cells not shown, a row decoder 202 responsive to a row address signal for selecting a row in memory cell array 201, a column decoder 203 responsive to a column address signal for selecting a column in memory cell array 201, and an address buffer 204 for receiving an externally applied address signal A0-An. Address signals A0-An include row and column address signals in a time divisional manner. Address buffer 204 provides a row address signal to row decoder 202, and a column address signal to column decoder 203.

A clock signal generator 206 receives a row address strobe signal /RAS, a column address strobe signal /CAS, an output enable signal /OE, and a write enable signal /WE to provide various clock signals to the internal circuit in DRAM 200.

DRAM 200 further includes data input/output circuits 211–21m. Each of data input/output circuits 211–21m is connected to a corresponding data input/output terminal DQ1-DQm. Each of data input/output circuits 211–21m includes an input buffer circuit and an output buffer circuit.

Higher voltage generators (HVG) 221–22m for data output are provided for every pair of data input/output circuits 211–21m. Each of higher voltage generators 221–22m responds to an applied output data signal for supplying a higher voltage to the output buffer circuit in a corresponding one of data input/output circuits 211–21m. Each of higher voltage generators 221–22m responds to a supplied burn-in test mode signal BRN for providing a high voltage having a reduced level.

DRAM 200 further includes a high voltage generator 207 for applying a high voltage to row decoder 202, a high voltage generator 208 for applying a high voltage to other circuits in DRAM 200, a burn-in mode detecting circuit 49 responsive to an externally applied power supply voltage Vcc level for detecting specification of a burn-in test mode, and a potential detecting circuit 45 for detecting an applied potential at a predetermined bonding pad 42t.

In FIG. 1, line 200 also indicates a semiconductor substrate. Therefore, bonding pad 42t is formed in semiconductor substrate 200. Ground potential Vss is selectively applied to bonding pad 42t via a wiring (or a gold wire). Potential detecting circuit 235 detects whether ground potential Vss is applied to bonding pad 42t to provide a detection signal φ1. Detection signal φ1 is supplied to the respective output buffer circuits of data input/output circuits 211–21m as control signal φ1.

Figure 2:
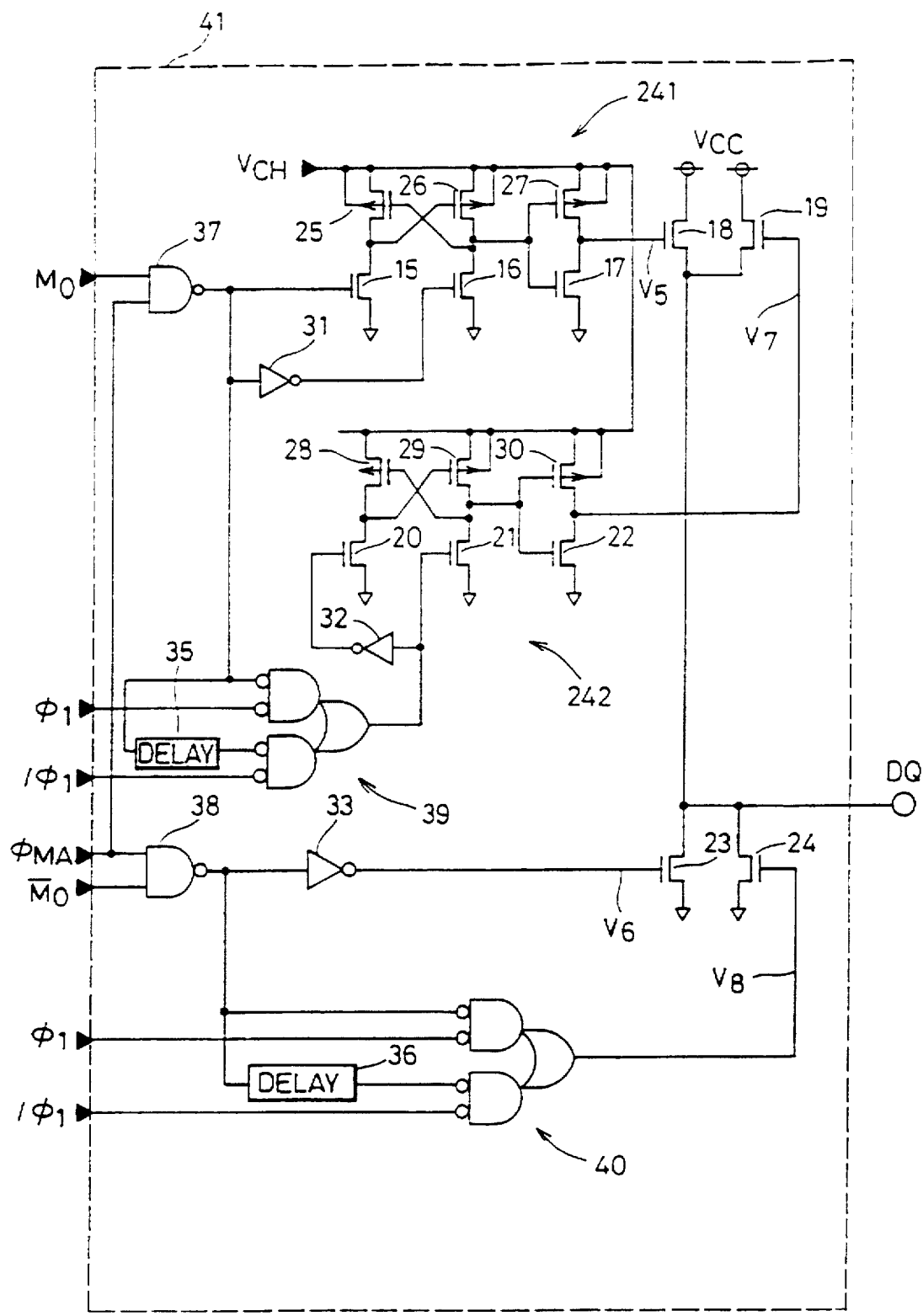
FIG. 2 is a circuit diagram of an output buffer circuit shown in FIG. 1.

FIG. 2 is a circuit diagram of one output buffer circuit shown in FIG. 1. Referring to FIG. 2, an output buffer circuit 41 includes NMOS transistors 15–24, PMOS transistors 25–30, inverters 31–33, delay elements 35 and 36, NAND gates 37–38, and OR-NAND gates 39 and 40.

Transistor 18 has a channel width smaller than transistor 19. Therefore, transistor 18 has a mutual conductance smaller than that of transistor 19. Transistor 23 has a channel width smaller than that of transistor 24. Therefore, transistor 23 has a mutual conductance smaller than that of transistor 24. In some cases, the channel length of transistor 18 is set longer than that of transistor 19, and the channel length of transistor 23 is set longer than that of transistor 24.

Output buffer circuit 41 is applied with a high voltage $V_{CH}$ from high voltage generator 208 shown in FIG. 1. Output buffer circuit 41 is also provided with externally applied power supply voltage Vcc. As an example, a power supply voltage Vcc of 3.3 V and a high voltage $V_{CH}$ of 5V is applied to output buffer circuit 41.

Output buffer circuit 41 is enabled in response to an enable signal $\phi_{MA}$ to fetch applied digital signals Mo and /Mo. More specifically, NAND gates 37 and 38 respond to an enable signal $\phi_{MA}$ to pass data signals Mo and /Mo.

Each of OR-NAND gates 39 and 40 receive control signals φ1 and /φ1 provided from potential detecting circuit 45 shown in FIG. 1. NOR-NAND gate 39 also receives an output signal of NAND gates 37. OR-NAND gate 40 also receives an output signal of NAND gates 38.

NAND gates 37 and 38, OR-NAND gates 39 and 40, and inverters 31 and 33 are supplied with power supply voltage Vcc. Level converting circuits 241 and 242 are provided with a high voltage $V_{CH}$ from high voltage generator 208 shown in FIG. 1.

Figure 3:
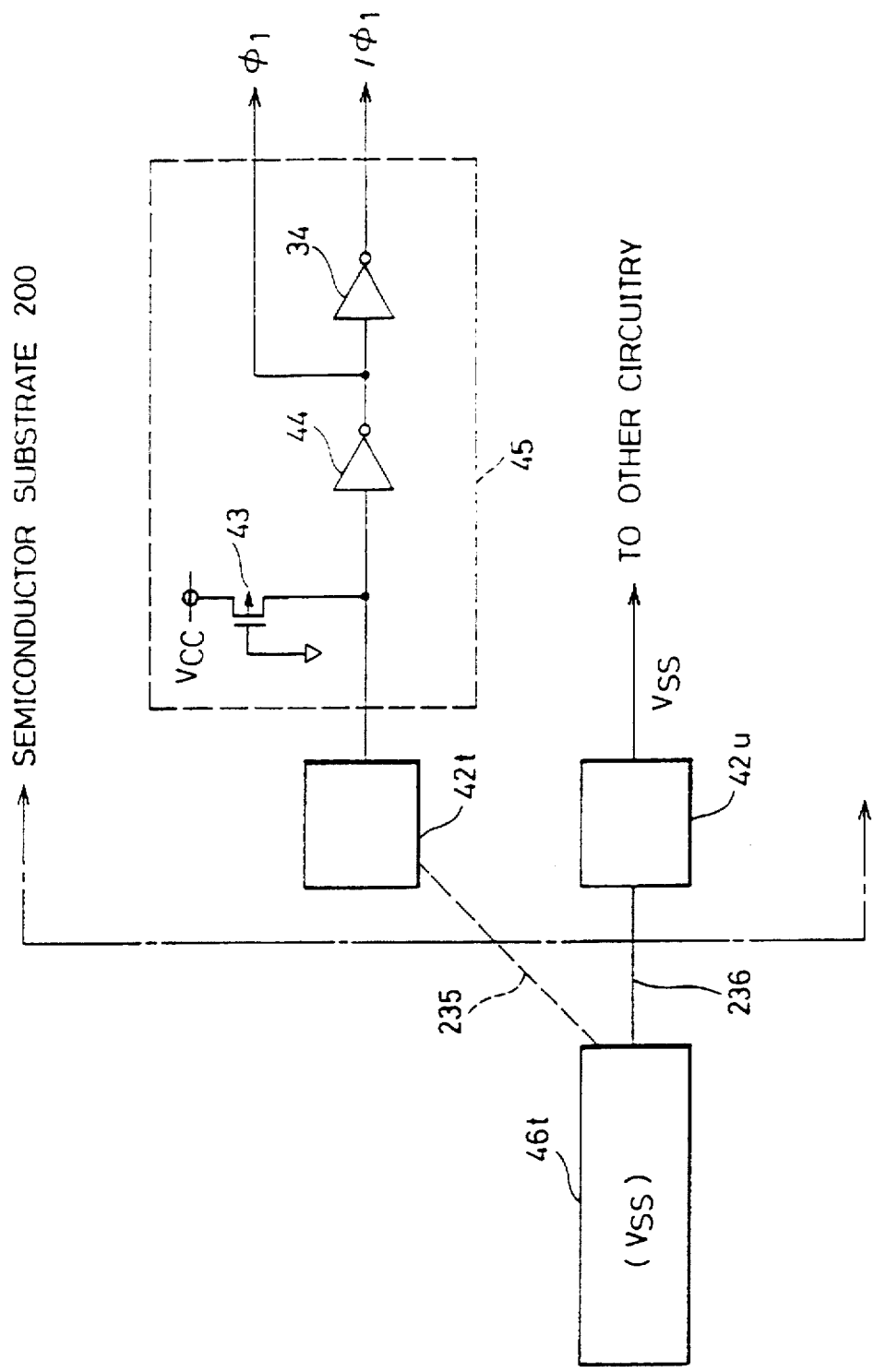
FIG. 3 is a circuit diagram of a potential detecting circuit shown in FIG. 1

FIG. 3 is a circuit diagram of the potential detecting circuit 45 of FIG. 1. Referring to FIG. 3, potential detecting circuit 45 includes cascaded inverters 44 and 34 connected to a predetermined bonding pad 42t, and a PMOS transistor 43 connected between an externally applied power supply potential Vcc and the input node of inverter 44. Transistor 43 has its gate electrode connected to ground potential Vss. Transistor 43 has a long channel length, and accordingly a low mutual conductance. Inverter 44 provides a signal $\phi1$ and inverter 34 provides an inverted signal $/\phi1$.

Ground input terminal (or ground input lead) 46t is provided for supplying ground potential Vss. A bonding pad 42u is connected to ground input terminal 46t via a wiring 236. Bonding pad 42t is selectively connected to ground input terminal 46t via a wiring 235. The input potential of inverter 44 differs depending upon whether a wiring 235 is provided or not. Bonding pads 42t and 42u are provided in semiconductor substrate 200. Transistor 43 has a low mutual conductance, and constantly attains a conductive state.

When output terminals DQ1-DQm of DRAM 200 are connected to a large capacitance load, wiring 235 is not provided. Therefore, inverter 44 receives an input voltage of high level due to the action of transistor 43. As a result, potential detecting circuit 45 provides a signal $\phi1$ of low level and a signal $/\phi1$ of high level.

When output terminals DQ1-DQm of DRAM 200 are connected to a small capacitance load, a gold wire 235 is provided. Therefore, ground potential is applied to the input node of inverter 44. As a result, potential detecting circuit 45 provides a signal $\phi1$ of high level and a signal $/\phi1$ of low level.

Figure 4:
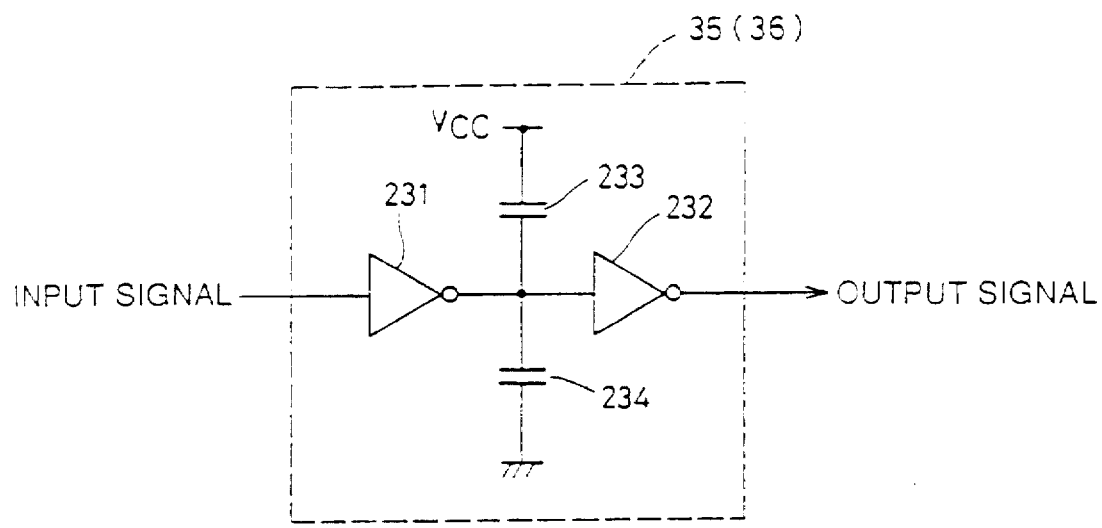
FIG. 4 is a circuit diagram of a delay circuit.

FIG. 4 is a circuit diagram of the delay circuit 35 (and 36) shown in FIG. 2. Referring to FIG. 4, delay circuit 35 includes cascaded inverters 231 and 232, and two capacitors 233 and 234. The delay time is determined by setting appropriately the capacitance of capacitors 233 and 234 and the mutual conductance of the transistor (not shown) forming inverter 231.

Figure 5:
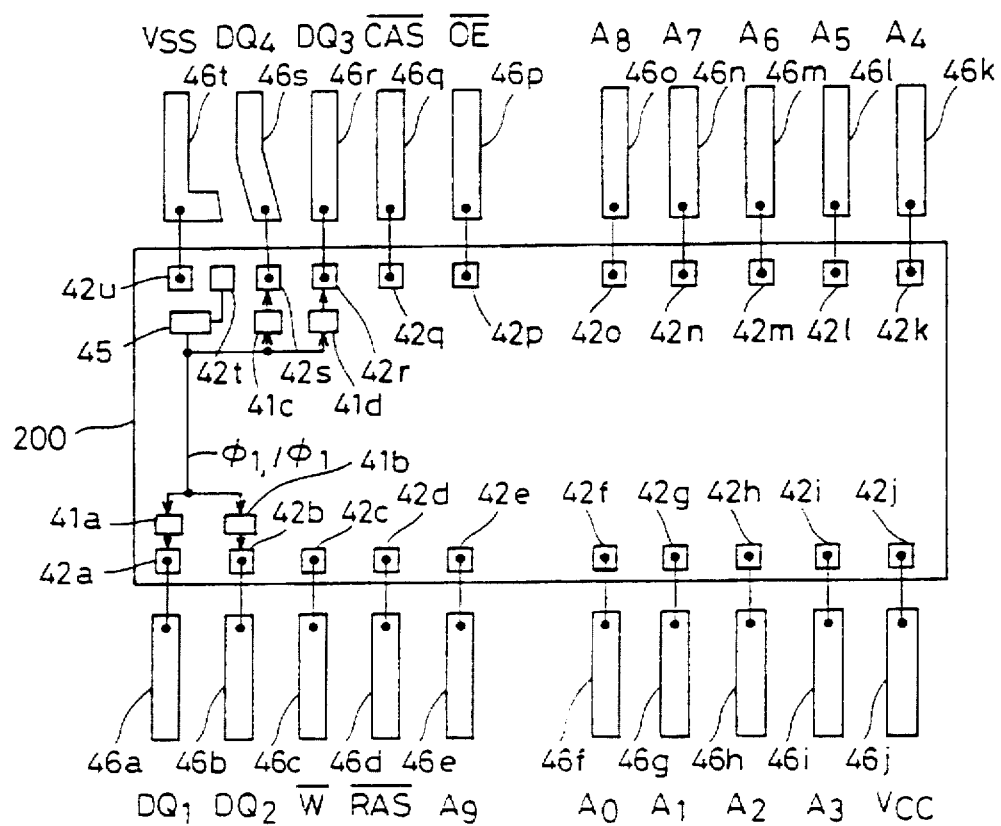
FIG. 5 is a bonding connection diagram in which the DRAM of FIG. 1 is used for a large capacitance load.

FIG. 5 is a bonding connection diagram in which DRAM 200 of FIG. 1 is used as a heavy load. In FIG. 5, DRAM 200 is shown as including four data output terminals DQ1-DQ4. Therefore, four output buffer circuits 41a-41d are provided. Potential detecting circuit 45 detects the potential at bonding pad 42t. Bonding pads 42a-42u are formed in semiconductor substrate 200. Each of bonding pads 42a-42u is connected to a corresponding one of input/output terminals (or lead) 46a-46t via a corresponding wiring. Because DRAM 200 of FIG. 5 is used for a large capacitance load, a wiring for connecting bonding pad 42t to input terminal 46t is not provided.

Figure 6:
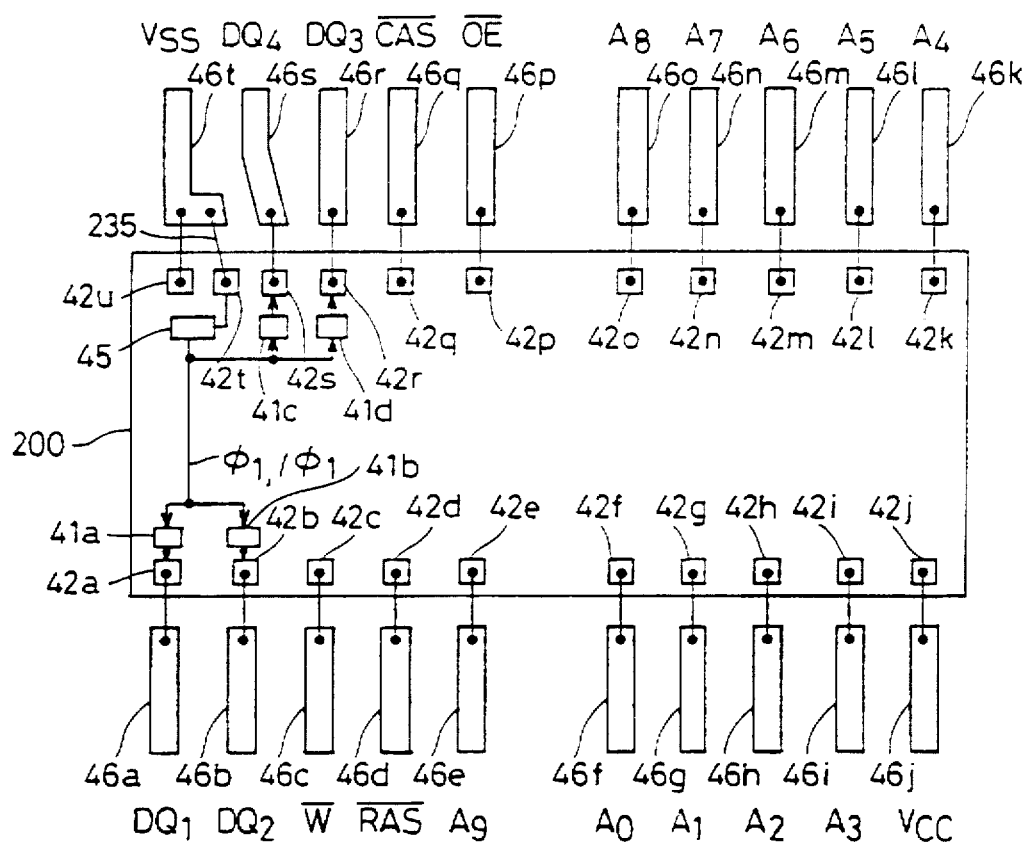
FIG. 6 is a bonding connection diagram in which the DRAM of FIG. 1 is used for a small capacitance load.

FIG. 6 is a bonding connection diagram in which DRAM 200 of FIG. 5 is used for a small capacitance load. Referring to FIG. 6, bonding pad 42t is connected to input terminal 46t via a wiring 235. Therefore, potential detecting circuit 45 provides a signal $\phi1$ of high level and a signal $/\phi1$ of low level. By just connecting a wiring 235, DRAM 200 is made appropriate to a light capacitance load.

Figure 7:
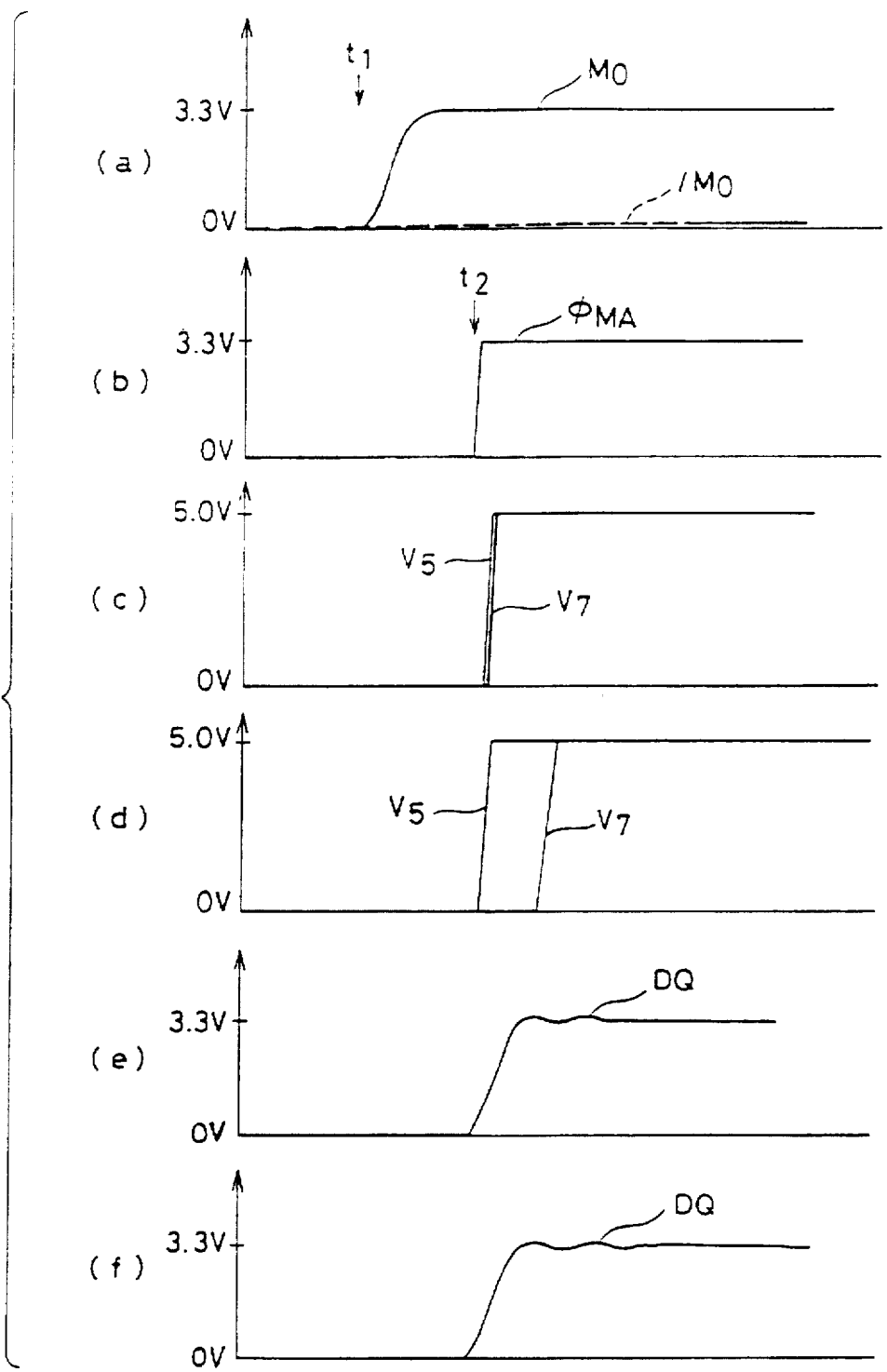
FIG. 7 is a timing chart of the output buffer circuit of FIG. 2.

FIG. 7 is a timing chart of the output buffer circuit 41 of FIG. 2. Referring to FIGS. 2 and 7, the operation of output buffer circuit 41 will be described.

At time t1, an applied data signal Mo rises to a high level, and data signal /Mo is maintained at low level. At time t2, an enable signal $\phi_{MA}$ is activated.

When DRAM 200 is used for a large capacitance load, a signal $\phi1$ of low level and a signal $/\phi1$ of high level are provided. Therefore, after time t2, the gate electrode V5 of transistor 18 and the gate electrode V7 of transistor 19 rise substantially at the same time. As a result, the large capacitance load (not shown) connected to output terminal DQ is charged simultaneously by two transistors 18 and 19. Therefore, output voltage DQ rapidly rises as shown in FIG. 7(e).

When DRAM 200 is used for a small capacitance load, a signal $\phi1$ of high level and a signal $/\phi1$ of low level are provided. Therefore, the gate voltages V5 and V7 of transistors 18 and 19 rise at different timings as shown in FIG. 7(d). More specifically, voltage V7 rises after voltage V5 rises. The time difference between voltages V5 and V7 is determined by delay circuits 35 and 36 shown in FIG. 2.

Therefore, transistor 18 conducts in response to the rise of voltage V5, and transistor 19 conducts in response to the rise of voltage V7. More specifically, in the case of light load, the light load is charged by transistor 18 having a small mutual conductance, followed by transistor 19 having a large mutual conductance turned on. As a result, rapid rise of output voltage DQ can be obtained even in the case of light load without ringing, as shown in FIG. 7(f). It is to be noted that a current supplying capability is identical in level whether wiring 235 is bonded or not after conduction of transistor 19.

Figure 8:
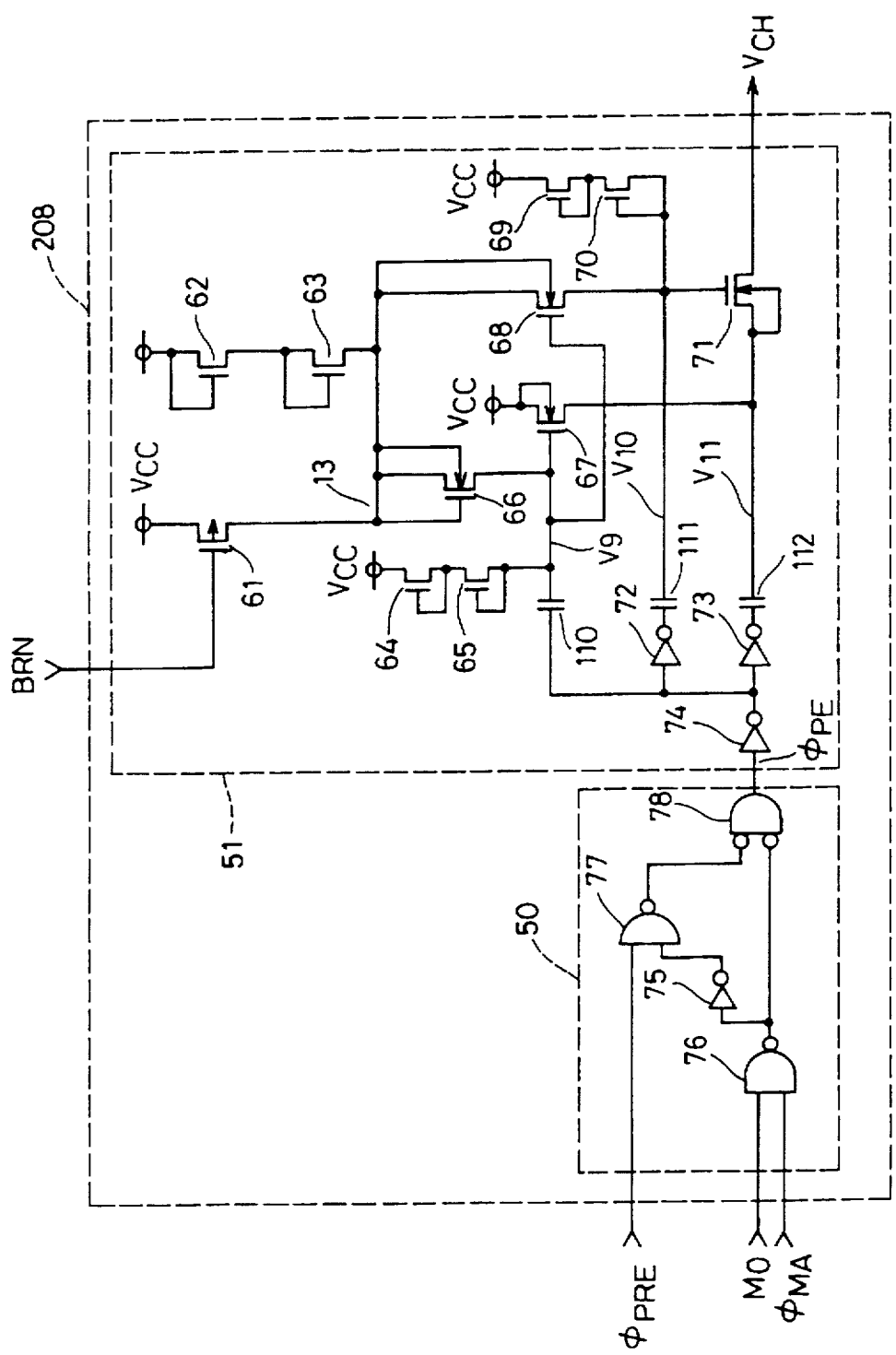
FIG. 8 is a circuit diagram of the high voltage generator 208 shown in FIG. 1.

FIG. 8 is a circuit diagram of the high voltage generator 208 shown in FIG. 1. Referring to FIG. 8, high voltage generator 208 includes a pump driving signal generating circuit 50, and a pump circuit 51. Pump driving signal generating circuit 50 includes an inverter 75, NAND gates 76 and 77, and an NOR gate 78. Pump circuit 51 includes NMOS transistors 62-71, a PMOS transistor 61, and inverters 72-74. Transistor 61 receives a burn-in mode signal BRN from burn-in test mode detecting circuit 49 of FIG. 1 via the gate electrode.

Figure 9:
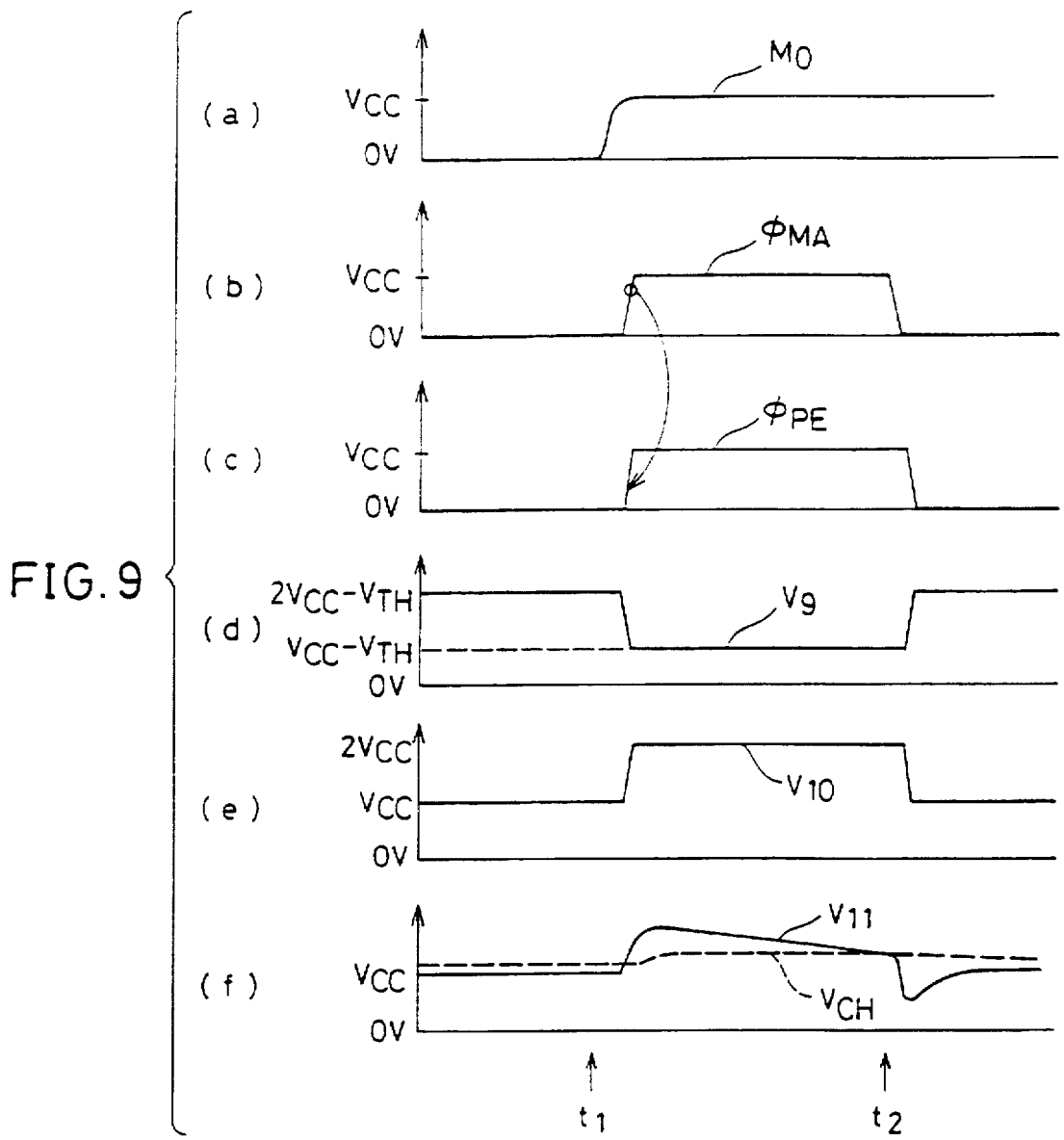
FIG. 9 is a timing chart in a normal operation mode of the high voltage generator shown in FIG. 8.

FIG. 9 is a timing chart of a normal operation mode of the high voltage generator 208 of FIG. 8. When high voltage generator 208 is operated, a pump enable signal $\phi_{PPE}$ of high level is provided. After data signal Mo of high level is provided at time t1, an enable signal $\phi_{MA}$ for the output buffer circuit rises. In response to the rise of signal $\phi_{MA}$, an activation signal $\phi_{PE}$ for pump circuit 51 rises (refer to FIG. 9(c)).

Prior to the rise of signal $\phi_{PE}$, i.e. during the low level period of signal $\phi_{PE}$, voltages V10 and V11 attain the level of power supply voltage Vcc via transistors 67, 69, and 70. Therefore, in response to the rise of signal $\phi_{PE}$, voltages V10 and V11 are boosted by the functions of capacitors 111 and 112. More specifically, voltage V10 is boosted to the level of 2 Vcc, and the boosted voltage is applied to the gate of transistor 71. Similarly, voltage V11 is boosted to be provided as high voltage $V_{CH}$ via transistor 71.

The high voltage generator 208 of FIG. 8 is used in each of high voltage generators 221 and 22m shown in FIG. 1. Therefore, a high voltage is provided from one of high voltage generators 221-22m corresponding to each output buffer circuit. Because a high voltage $V_{CH}$ is provided to each output buffer circuit (for example circuit 41 shown in FIG. 2) in response to a data signal Mo, a required high voltage can be supplied under appropriate power consumption.

Figure 10:
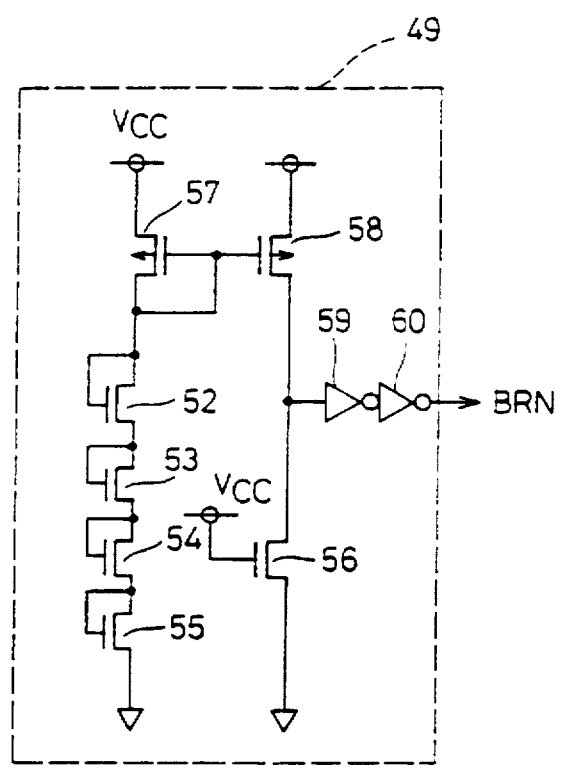
FIG. 10 is a circuit diagram of a burn-in test mode detecting circuit of FIG. 1.

FIG. 10 is a circuit diagram of the burn-in test mode detecting circuit 209 of FIG. 1. Generally, a burn-in test is carried out in semiconductor manufacturing factories to detect initial defaults in the produced semiconductor device. A voltage higher than the normal power supply voltage is supplied as power supply voltage to a semiconductor device during a burn-in test. If some measure is not taken to cope with the burn-in test high voltage supplied to DRAM 200 of FIG. 1, damage of the internal circuit of DRAM 200 can occur due to the high voltage generated by the higher voltage generator. Therefore, the following measures are applied in DRAM 200.

Referring to FIG. 10, a burn-in test mode detecting circuit 49 includes NMOS transistors 52–56, PMOS transistors 57 and 58, and inverters 59 and 60. When the normal external power supply voltage Vcc is 3.3 V, a high voltage exceeding 4 V is supplied as power supply voltage Vcc in a burn-in test mode. Therefore, when a power supply voltage Vcc exceeding 4 V is supplied, transistors 52 and 55 are turned on to cause a burn-in test mode signal BRN of high level to be provided. When a power supply voltage Vcc lower than 4 V is supplied, a signal BRN of low level is provided. Output signal BRN is provided to each of higher voltage generators 221-22m, i.e. high voltage generator 208 shown in FIG. 8.

Figure 11:
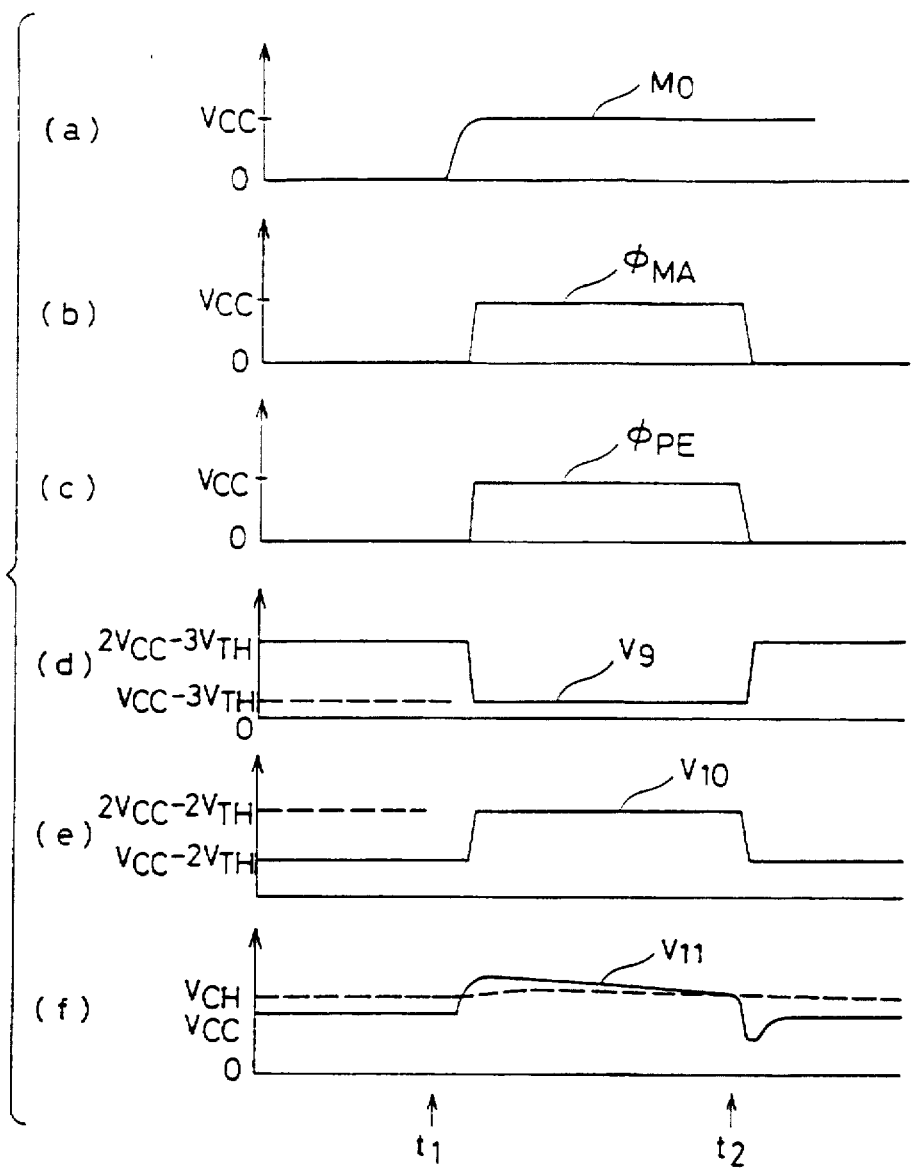
FIG. 11 is a timing chart of a burn-in test mode of the high voltage generator of FIG. 8.

FIG. 11 is a timing chart of a burn-in test mode of high voltage generator 208 of FIG. 8. Referring to FIGS. 8 and 11, a burn-in test mode signal BRN of high level is applied during a burn-in test mode. Transistor 61 is turned off in response to signal BRN. As a result, voltages V10 and V11 attain a level lower than power supply voltage Vcc prior to boosting. More specifically, voltage V9 attains a level 2Vcc-3$V^{TH}$ reduced by transistors 62, 63 and 66 prior to boosting (FIG. 11(d)). Voltage V10 attains the level of Vcc-2 $V^{TH}$ reduced by transistors 62 and 63 prior to boosting.

After boosting, voltage V9 attains Vcc-3 $V_{TH}$ (=approximately 7 V), and voltage V10 attains 2Vcc-2 $V_{TH}$ (=approximately 8 V). Therefore, voltages V10 and V11 do not exceed the levels of approximately 7 V and approximately 8V, respectively, in pump circuit 51 shown in FIG. 8, so that damage of a normal circuit can be prevented.

If the above-described measures are not applied, voltages V9 and V10 attain approximately 9V and approximately 10V, respectively, when a power supply voltage Vcc of 5V is applied during a burn-in test mode. Such a high voltage generation may cause the damage of pump circuit 51. It is to be noted that transistor 61 shown in FIG. 8 functions effectively as described above to prevent such a problem.

Protection of the internal circuit from a high voltage generated during burn-in test mode is also carried out in other internal circuitry. An example of protection in a word line driving circuit will be described hereinafter.

Figure 12:
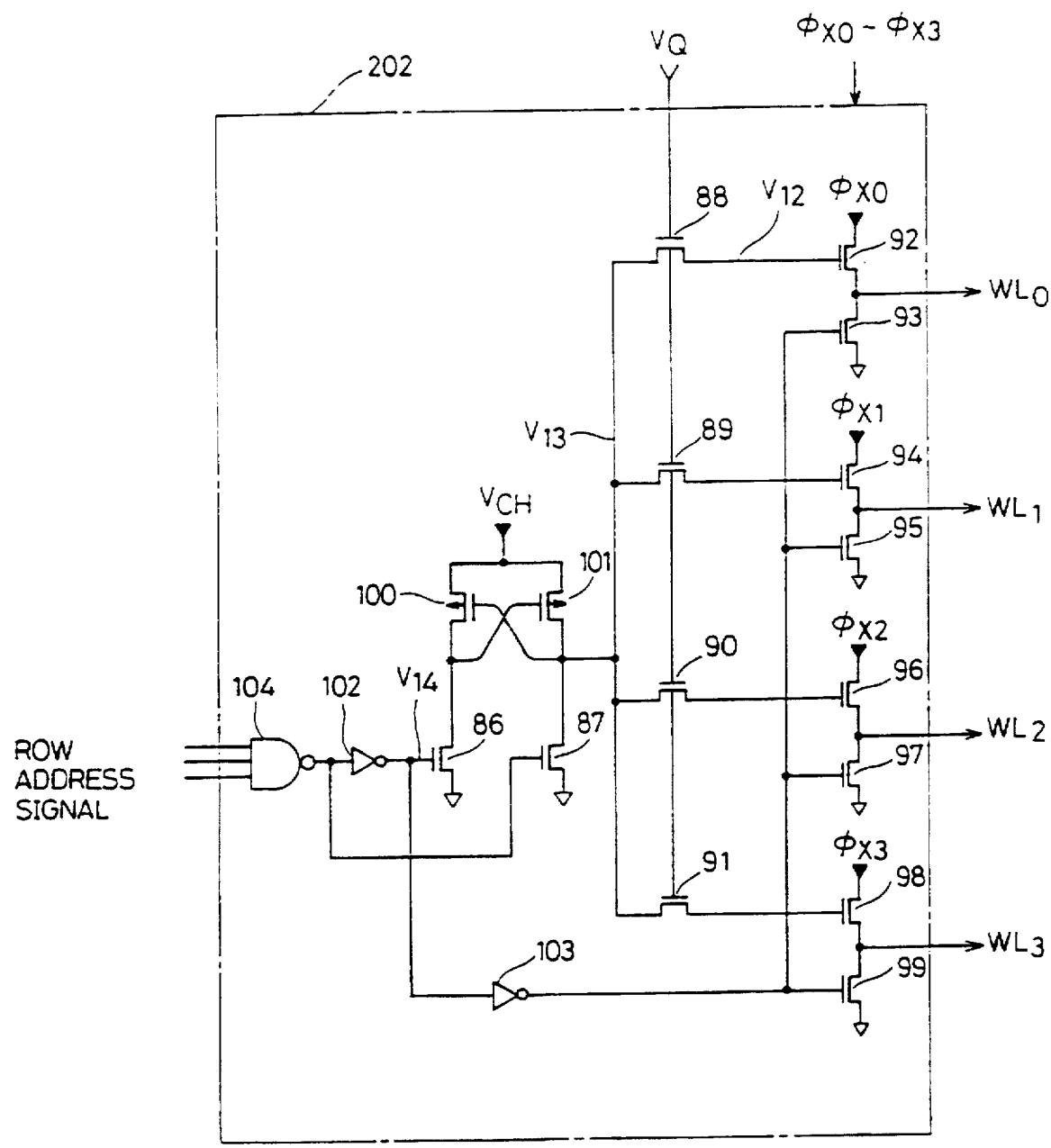
FIG. 12 is a circuit diagram of the row decoder shown in FIG. 1.

FIG. 12 is a circuit diagram of row decoder 202 of FIG. 1. Referring to FIG. 12, row decoder 202 includes NMOS transistors 86–92, PMOS transistors 100 and 101, inverters 102 and 103, and an NAND gate 104. NAND gate 104 is connected to receive a row address signal. A high voltage $V_Q$ is applied to the gate electrodes of each of transistor 88–91. Row decoder 202 responds to a row address signal to selectively activate one of word lines WL0–WL3.

Figure 13:
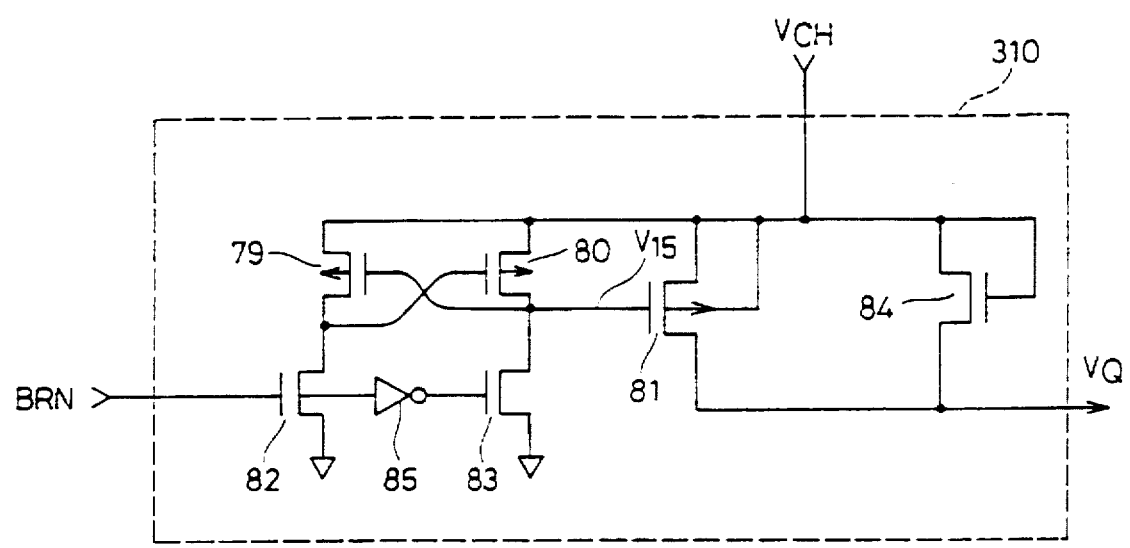
FIG. 13 is a circuit diagram of the high voltage transmission circuit for transmitting high voltage to the row decoder of FIG. 12.

FIG. 13 is a circuit diagram of a high voltage transmission circuit for transmitting a high voltage to row decoder 202 of FIG. 12. Referring to FIG. 13, a high voltage transmission circuit 310 includes NMOS transistors 82, 83 and 84, PMOS transistors 79, 80 and 81, and an inverter 85.

Figure 14:
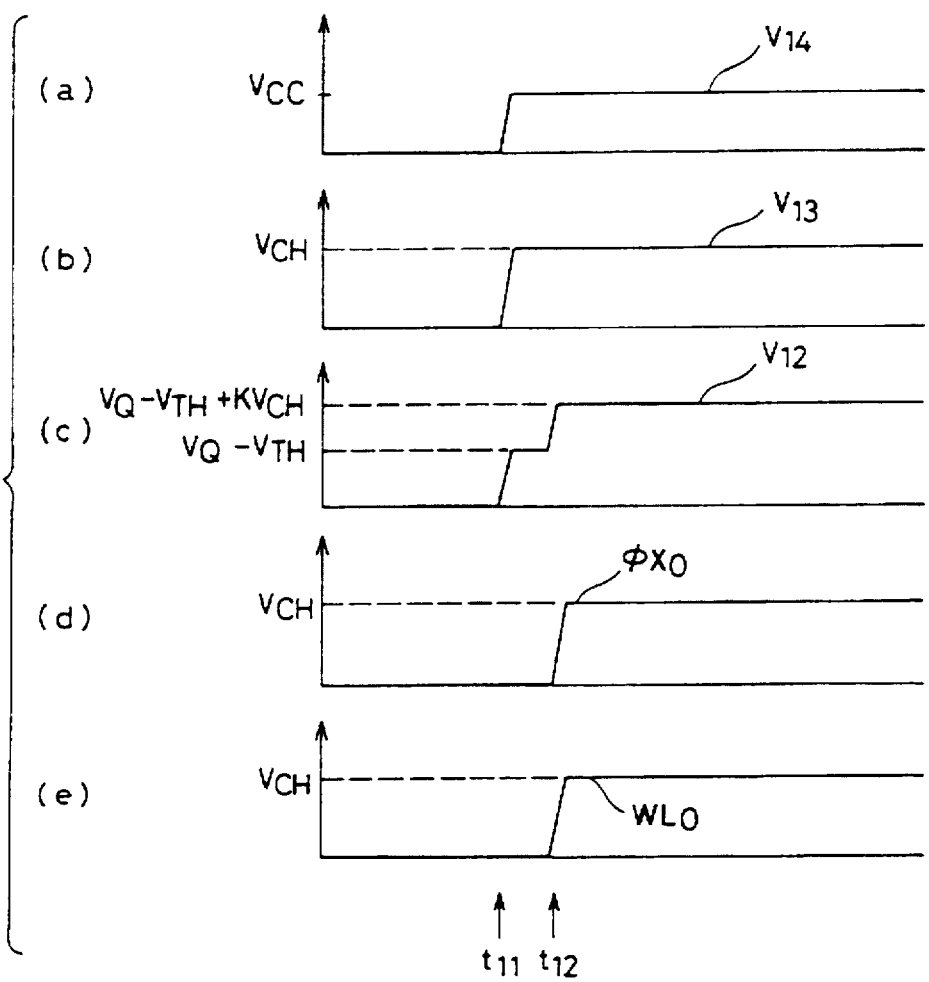
FIG. 14 is a timing chart for describing the operation of the circuit shown in FIGS. 12 and 13.

FIG. 14 is a timing chart for describing the operation of the circuits shown in FIGS. 12 and 13. At time t11, NAND gate 104 shown in FIG. 12 is enabled, whereby the gate voltage V14 of transistor 86 rises. In response to the rise of voltage V14, voltage V13 rises to the high voltage level of $V_{CH}$. For example, when word line WL0 is activated, a high voltage $V_Q$ is applied to the gate electrode of transistor 88, whereby the gate voltage V12 of transistor 92 attains $V_Q$-$V_{TH}$ (here, $V_{TH}$ is the threshold voltage of transistor 88).

At time t12 when a signal $\phi_{XO}$ rises to the high voltage level of $V_{CH}$, gate voltage V12 is boosted by the coupling of the gate-source capacitance of transistor 92. Assuming that this boosting efficient factor is K, voltage V12 attains $V_Q$-$V_{TH}$+K·$V_{CH}$. When the potential of V12 is higher than the potential $V_{CH}$ of signal $\phi_{XO}$ by more than $V_{TH}$, the potential of word line WL0 becomes $V_{CH}$.

In normal operation mode, i.e. when a power supply voltage Vcc of 3.3V is supplied, a burn-in mode detection signal BRN of low level is provided to high voltage transmission circuit 310 of FIG. 13. As a result, the gate voltage V15 of transistor 81 attains a low level, whereby an output voltage $V_Q$ of $V_{CH}$ is provided via transistor 81. Therefore, the gate voltage V12 of transistor 92 shown in FIG. 12 attains the level of (1+K)·$V_{CH}$-$V_{TH}$ after time t12, as shown in FIG. 14(c). If K=0.5, $V_{CH}$=5 V, and $V_{TH}$=1 V, for example, voltage V12 attains the level of 6.5V after time t12.

In a burn-in test mode, i.e. when a power supply voltage Vcc of 5V is supplied, a signal BRN of high level is provided to high voltage transmission circuit 310 of FIG. 13. Therefore, the gate voltage V15 of transistor 81 attains the level of $V_{CH}$ to turn off transistor 81. As a result, an output voltage $V_Q$ of $V_{CH}$-$V_{TH}$ is provided. Therefore, the gate voltage V12 of transistor 92 shown in FIG. 12 attains the level of (1+K)·$V_{CH}$-2·$V_{TH}$ (=7 V) after time t2. Therefore, gate voltage V12 is prevented from attaining an excessive high voltage in burn-in test mode. This prevents the internal circuit of row decoder 202 from being damaged during a burn-in test mode operation.

Figure 15:
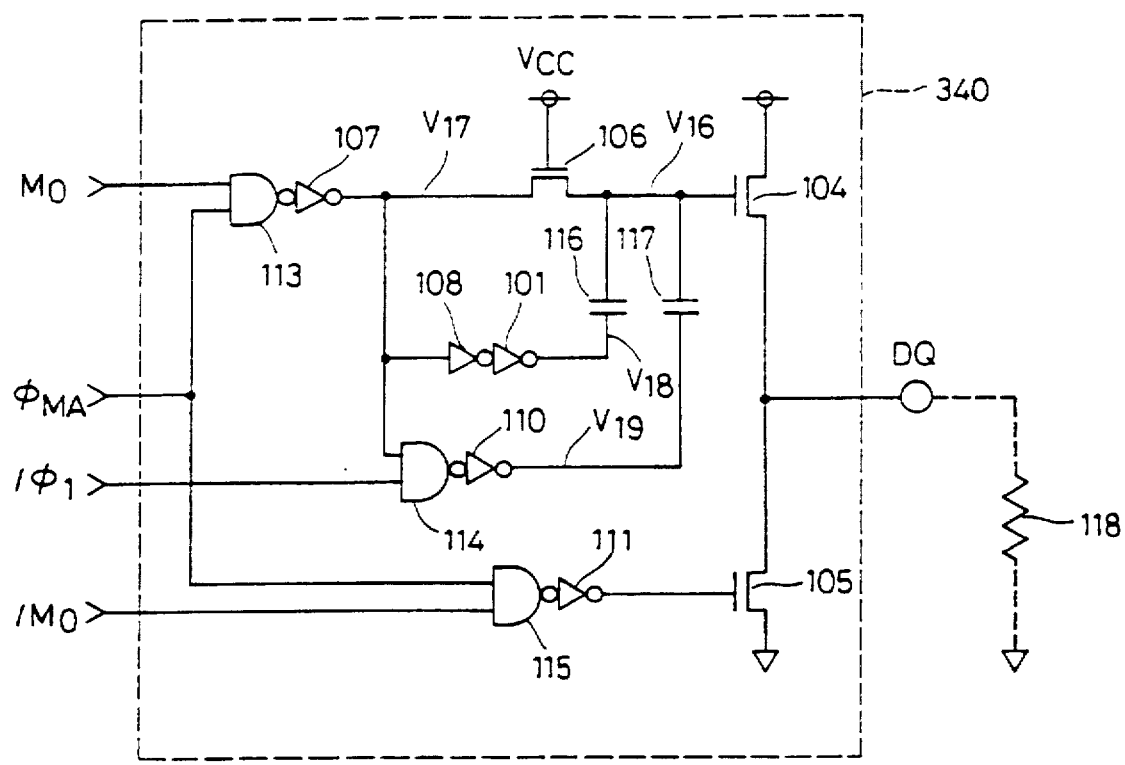
FIG. 15 is a circuit diagram of the output buffer circuit showing another embodiment of the present invention.

FIG. 15 is a circuit diagram of an output buffer circuit showing another embodiment of the present invention. Referring to FIG. 15, an output buffer circuit 340 includes NMOS transistors 104–106, inverters 107–112, NAND gates 113–115, and capacitors 116 and 117. The output buffer circuit 340 shown in FIG. 15 is used in a semiconductor integrated circuit device such as a DRAM.

Figure 16:
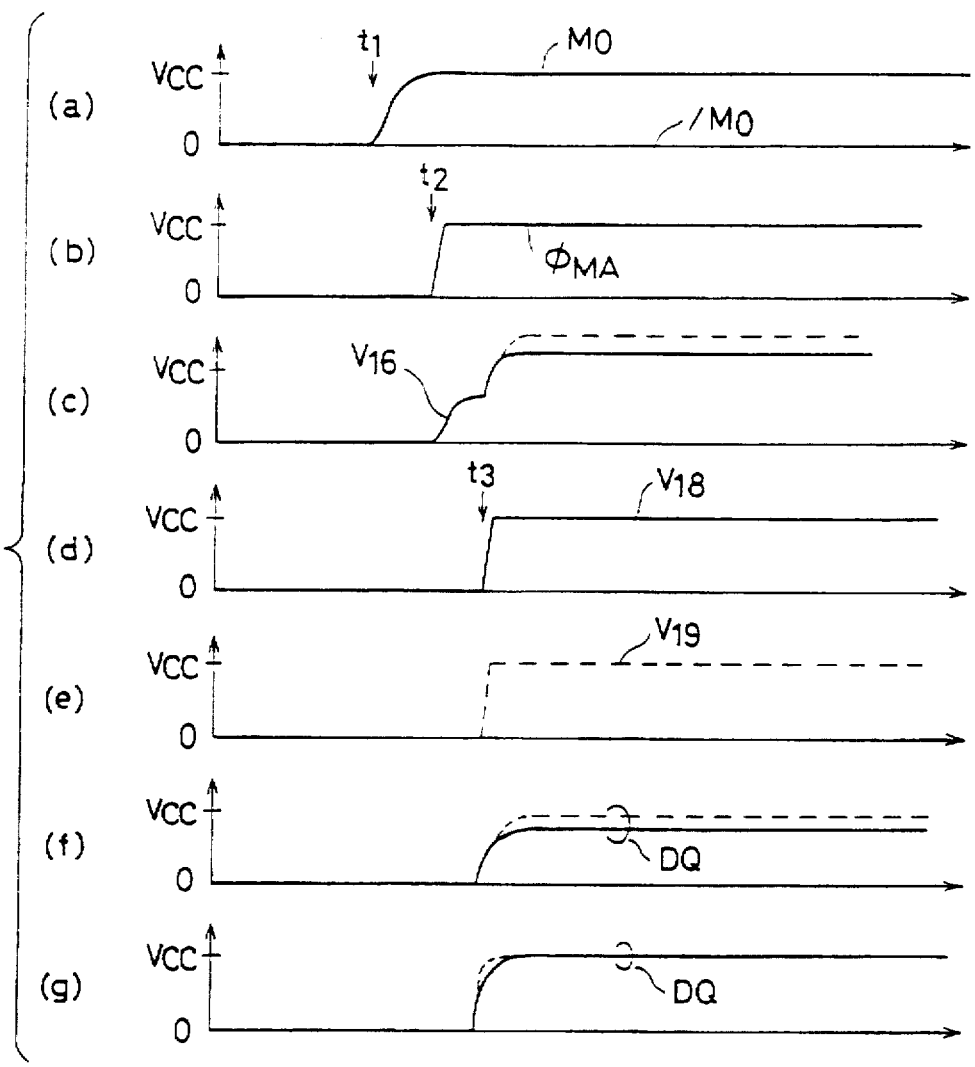
FIG. 16 is a timing chart of the output buffer circuit of FIG. 15.

FIG. 16 is a timing chart of the output buffer circuit 340 of FIG. 15. Following the rise of data signal Mo at time t1, enable signal $\phi_{MA}$ rises at time t2. In response to the rise of signal $\phi_{MA}$, the output voltage V17 of inverter 107 attains the power supply voltage level of Vcc, whereby the gate voltage V16 of transistor 104 attains the level of VCC-$V_{TH}$ (here, $V_{TH}$ is the threshold voltage of transistor 106). When heavy load is connected to output terminal DQ, a signal /$\phi$1 of high level is provided to NAND gate 114. Therefore, the output voltages V18 and V19 of inverters 101 and 110 respectively attain a high level at time t3. As a result, the gate voltage V16 of transistor 104 is boosted to a further higher level by the function of the two capacitors 116 and 117 (indicated by a broken line in FIG. 16(c)).

When light load is connected to output terminal DQ, a signal /$\phi$1 of low level is provided. In this case, only output voltage V18 of inverter 101 attains a high level at time t3. Therefore, the gate voltage V16 of transistor 104 is boosted to a level lower than the case of a heavy load after time t3.

The channel resistance (or ON resistance) of transistor 104 becomes further lower in the case of a heavy load, and becomes further higher in the case of a light load. In other words, the load is charged by a great current via transistor 104 in the case of a heavy load, and charged by a lower current in the case of a light load. Because a current can be provided to the load at a rate suitable to the size of the load, generation of noise such as ringing is prevented.

The output buffer circuit 340 of FIG. 15 has the following advantage for the amplitude of an output signal. When an equivalent load resistor 118 connected to output terminal DQ is small, the level of output voltage DQ is determined by the resistance division of the channel resistance (or ON resistance) of transistor 104 and the resistance of equivalent resistor 118 when an output data of "H" is provided. Thus, a greater logic amplitude can be provided in the case where a signal /φ1 of high level is provided in comparison with the case where a signal /φ1 of low level is provided.

When equivalent load resistor 118 is high, the level of output voltage DQ attains the level of Vcc if voltage V16 is boosted to a level greater than VCC+$V_{TH}$. However, because the channel resistor of transistor 104 is lower in the case where a signal φ1 of low level is provided, a rapid rise of output voltage DQ is obtained. Therefore, the output data amplitude can be reduced by applying a signal φ1 of high level.

Figure 17:
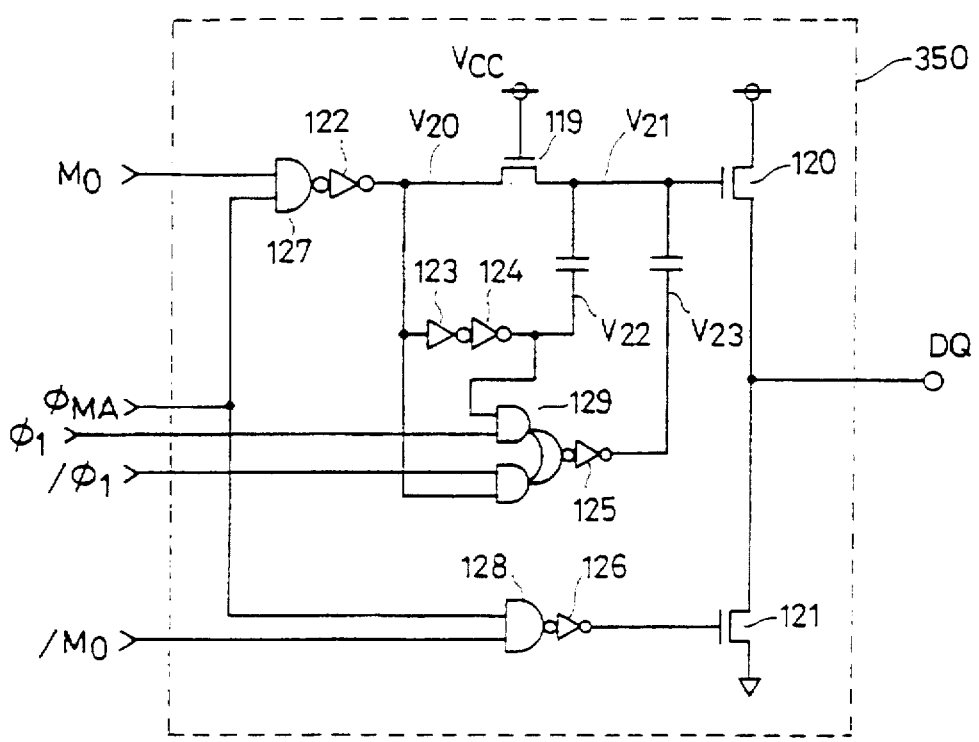
FIG. 17 is a circuit diagram of an output buffer circuit showing a further embodiment of the present invention.

FIG. 17 is a circuit diagram of an output buffer circuit showing a further embodiment of the present invention. Referring to FIG. 17, an output buffer circuit 350 includes NMOS transistors 119–121, inverters 122–126, NAND gates 127 and 128, and an AND-NOR gate 129.

Figure 18:
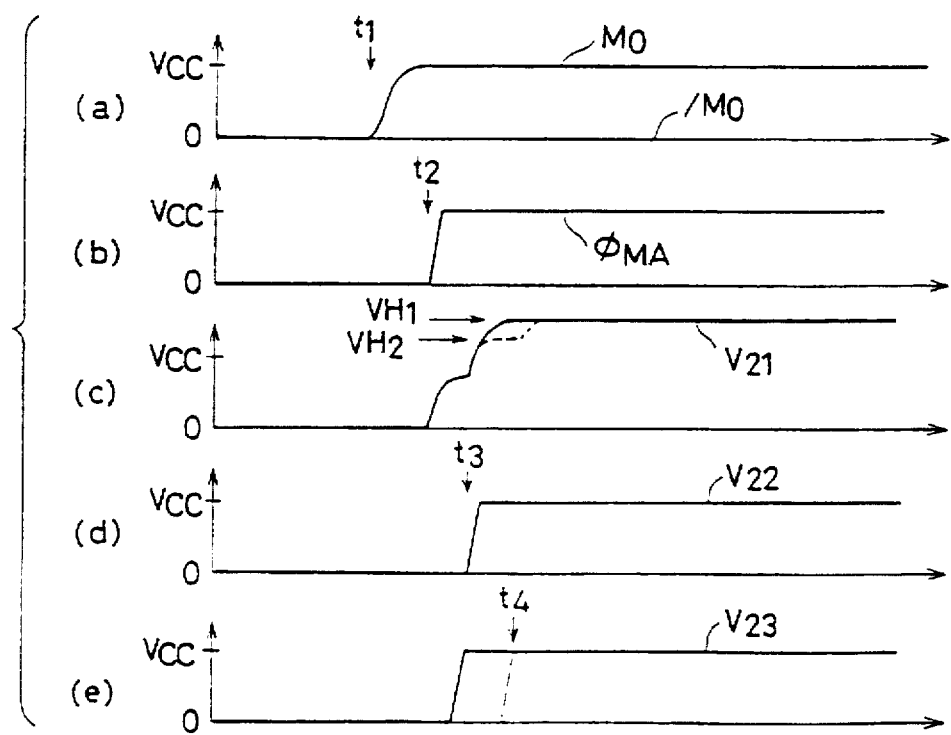
FIG. 18 is a timing chart of the output buffer circuit of FIG. 17.

FIG. 18 is a timing chart of the output buffer circuit 350 of FIG. 17. Following the provision of a data signal Mo of high level at time t1, enable signal $\phi_{MA}$ rises at time t2. In response, the output voltage V20 of inverter 122 attains the Vcc level of power supply voltage. Therefore, the gate voltage V21 of transistor 120 attains the level of VCC-$V_{TH}$ (here, $V_{TH}$ is the threshold voltage of transistor 119).

When heavy load is connected to output terminal DQ, a signal φ1 of low level and a signal /φ1 of high level are provided. Because voltages V22 and V23 both rise to a high level simultaneously at time t3, the gate voltage V21 of transistor 120 is boosted to a higher level of VH1.

When output terminal DQ is connected to light load, a signal φ1 of high level and a signal /φ1 of low level are provided. Following the rise of voltage V22 to a high level at time t3, voltage V23 rises at time t4. Therefore, the gate voltage V21 of transistor 120 is first boosted to the level of VH2 after time t3, and then further boosted to the level of VH1 after time t4. In the case of a light load, transistor 120 conducts at a relatively high channel resistance (or ON resistance), and then conducts at a lower channel resistance. Therefore, rapid rise of output voltage DQ can be obtained in both cases of heavy load and light load. Furthermore, generation of noise such as ringing can be prevented.

Figure 19:
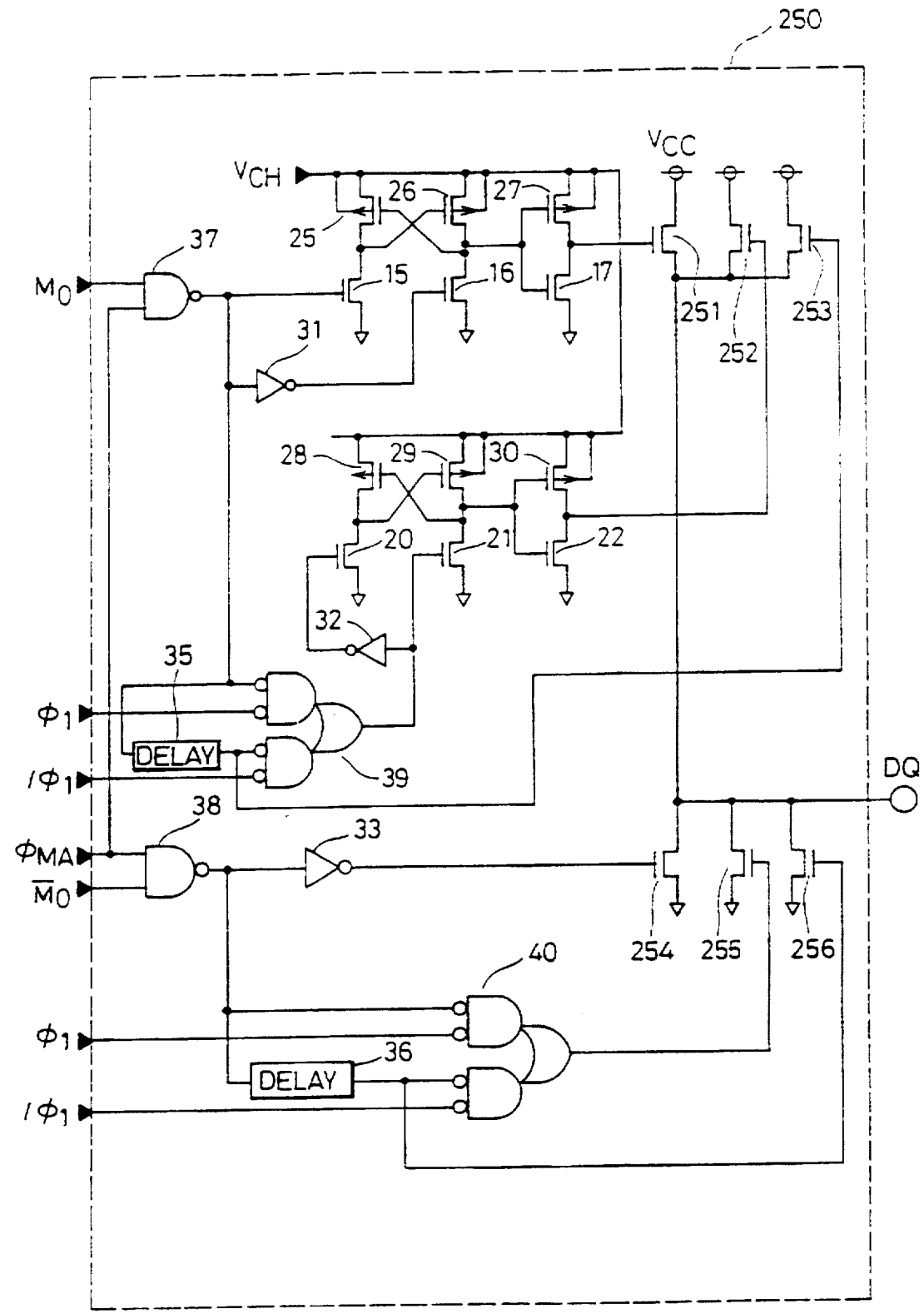
FIGS. 19–21 each show a circuit diagram of an output buffer circuit according to still another embodiment of the present invention.

FIG. 19 is a circuit diagram of an output buffer circuit showing still another embodiment of the present invention. Referring to FIG. 19, an output buffer circuit 250 includes NMOS transistors 251–256 connected to output terminal DQ. The structures of the remaining circuits excluding transistors 251–256 are similar to those of the circuits shown in FIG. 2, and their description will not be repeated. Assuming that transistors 251–256 have mutual conductance of gm11, gm12, gm13, gm14, gm15, and gm16, respectively, the following relationship is provided between these mutual conductances:

gm11<gm13    (1)

gm12<gm13    (2)

gm14<gm16    (3)

gm15<gm16    (4)

In operation, when heavy load is connected to output terminal DQ, a signal φ1 of low level and a signal /φ1 of high level are provided. Therefore, in response to the provision of a data signal Mo of high level, transistors 251 and 252 conduct simultaneously, and transistor 253 conducts with a delay.

When light load is connected to output terminal DQ, a signal φ1 of high level and signal /φ1 of low level are provided. In response to an application of a data signal Mo of high level, transistor 251 conducts, followed by conduction of transistors 252 and 253 with delay.

Because the increasing rate of current applied to the load can be controlled in both cases of heavy load and light load, rapid rise of output voltage DQ can be obtained. Also, generation of noise can be prevented.

Figure 20:
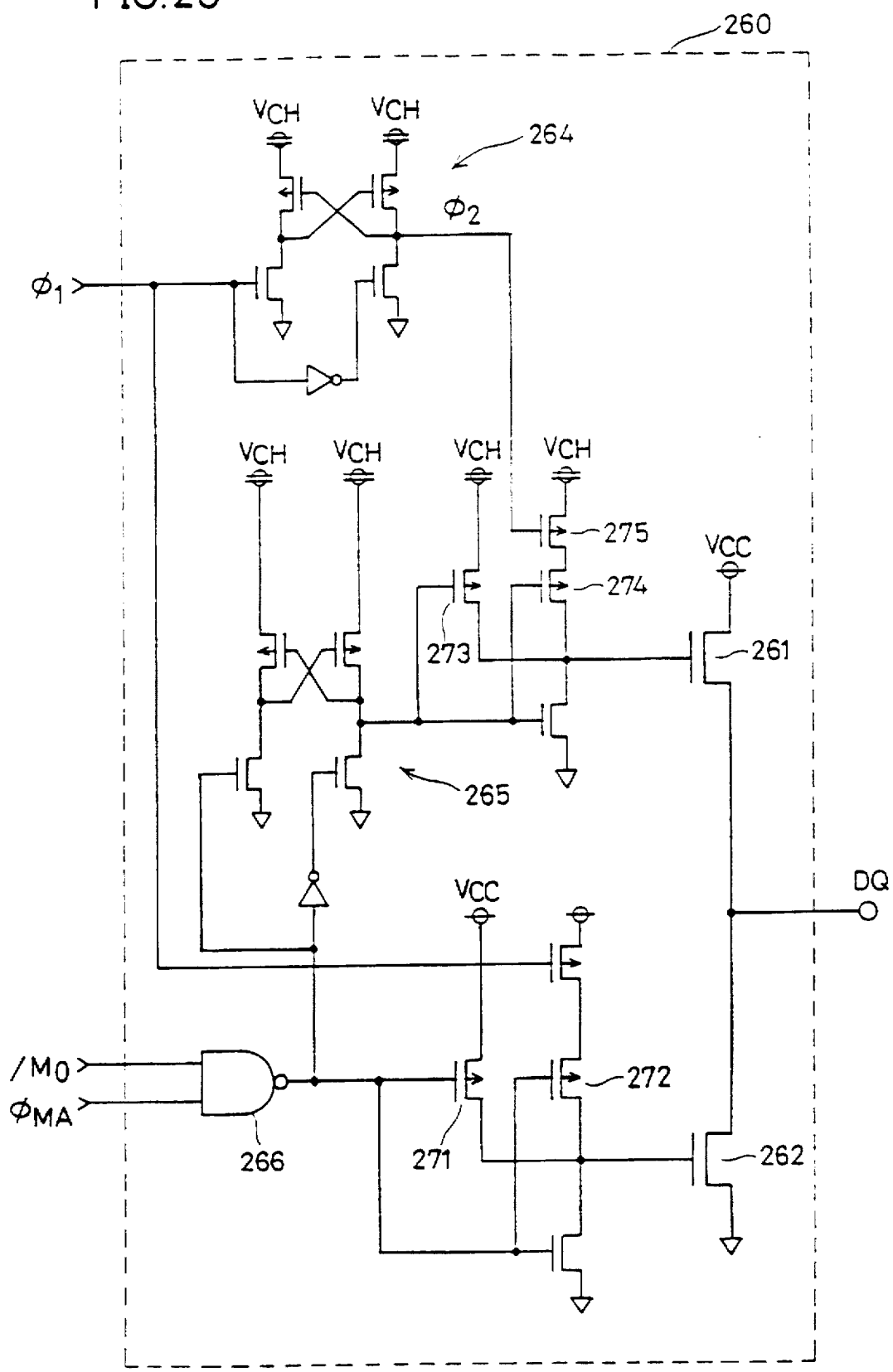

FIG. 20 is a circuit diagram of an output buffer circuit according to a still further embodiment of the present invention. Referring to FIG. 20, an output buffer circuit 260 includes NMOS transistors 261 and 262, PMOS transistors 271–275, level converting circuits 264 and 265, and an NAND gate 266.

When heavy load is connected to output terminal DQ, a signal φ1 of low level is provided. Therefore, transistor 275 conducts in response to a signal φ2 of low level. As a result, in response to a data signal /Mo of low level, the gate electrode of transistor 261 is charged via the two transistors 273 and 274. More specifically, the gate voltage of transistor 261 is rapidly charged, whereby the channel resistance (or ON resistance) of transistor 261 is rapidly reduced. As a result, a rapidly increasing current can be provided to a large capacitance load.

When a light load is connected to output terminal DQ, a signal φ1 of high level is provided. Therefore, transistor 275 is turned off in response to a signal φ2 of high level. As a result, the gate electrode of transistor 261 is charged by one transistor 273. Therefore, the channel resistance of transistor 261 is decreased more mildly in comparison with the case of a large capacitance load. Therefore, a relatively mildly increasing current is applied in a small capacitance load.

Figure 21:
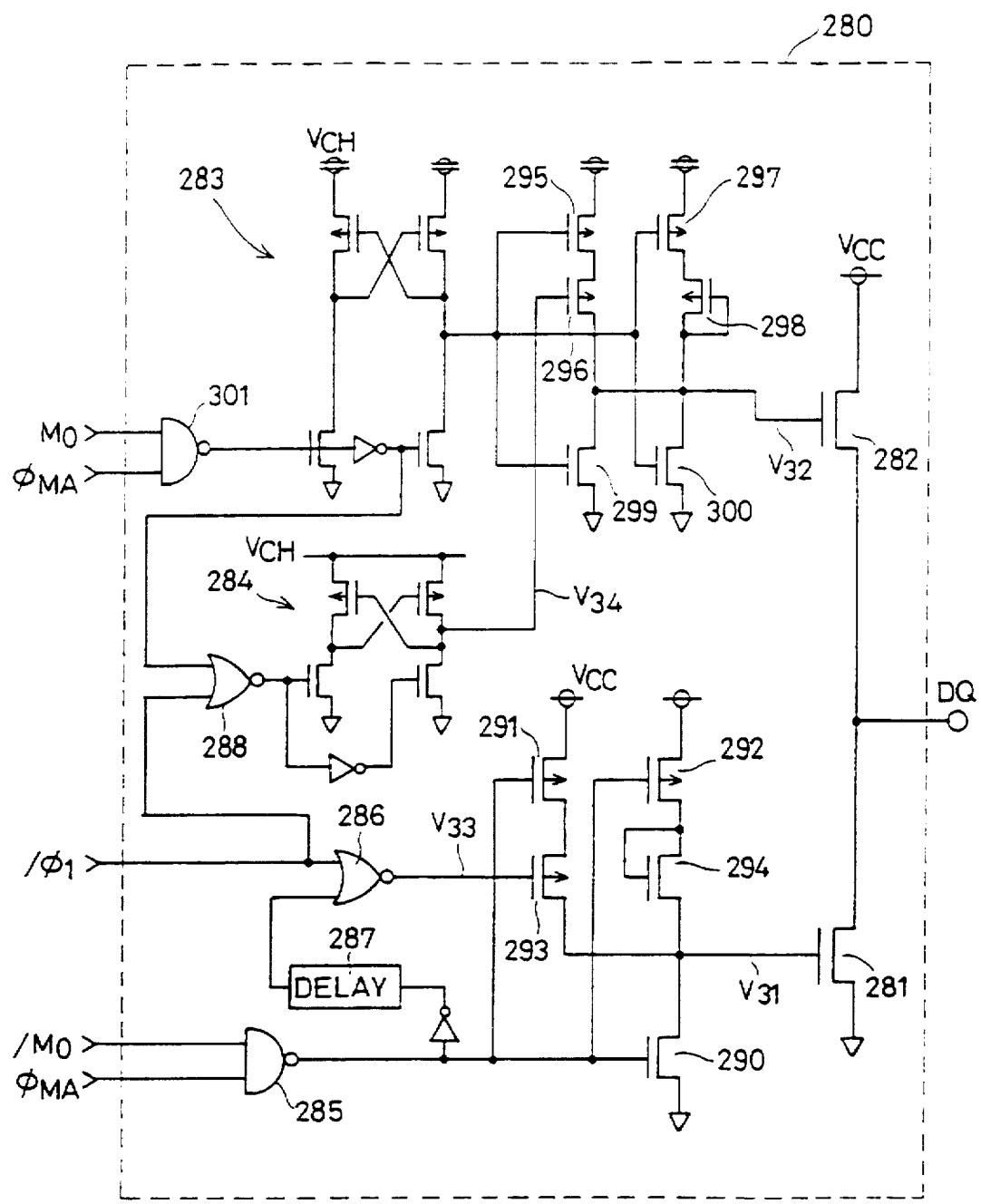

FIG. 21 is a circuit diagram of an output buffer circuit according to yet a further embodiment of the present invention. Referring to FIG. 21, an output buffer circuit 280 includes NMOS transistors 281, 282, 290, 294, PMOS transistors 291, 292, 293, 295 and 296, level converting circuits 283 and 285, NAND gates 285 and 301, NOR gates 286 and 288, and a delay circuit 287.

Following the rise of data signal Mo at time t1, an enable signal $\phi_{MA}$ rises at time t2. When heavy load is connected to output terminal DQ, a signal /φ1 of high level is provided. Because gate voltages V33 and V34 of low level are provided to transistors 293 and 296, respectively, transistors 293 and 296 conduct. Therefore, the gate electrode V31 of transistor 281 is charged to the level of power supply voltage Vcc. The gate voltage V32 of transistor 282 is charged to the level of high voltage $V_{CH}$. As a result, a current increased at high rate is provided in heavy load.

Figure 22:
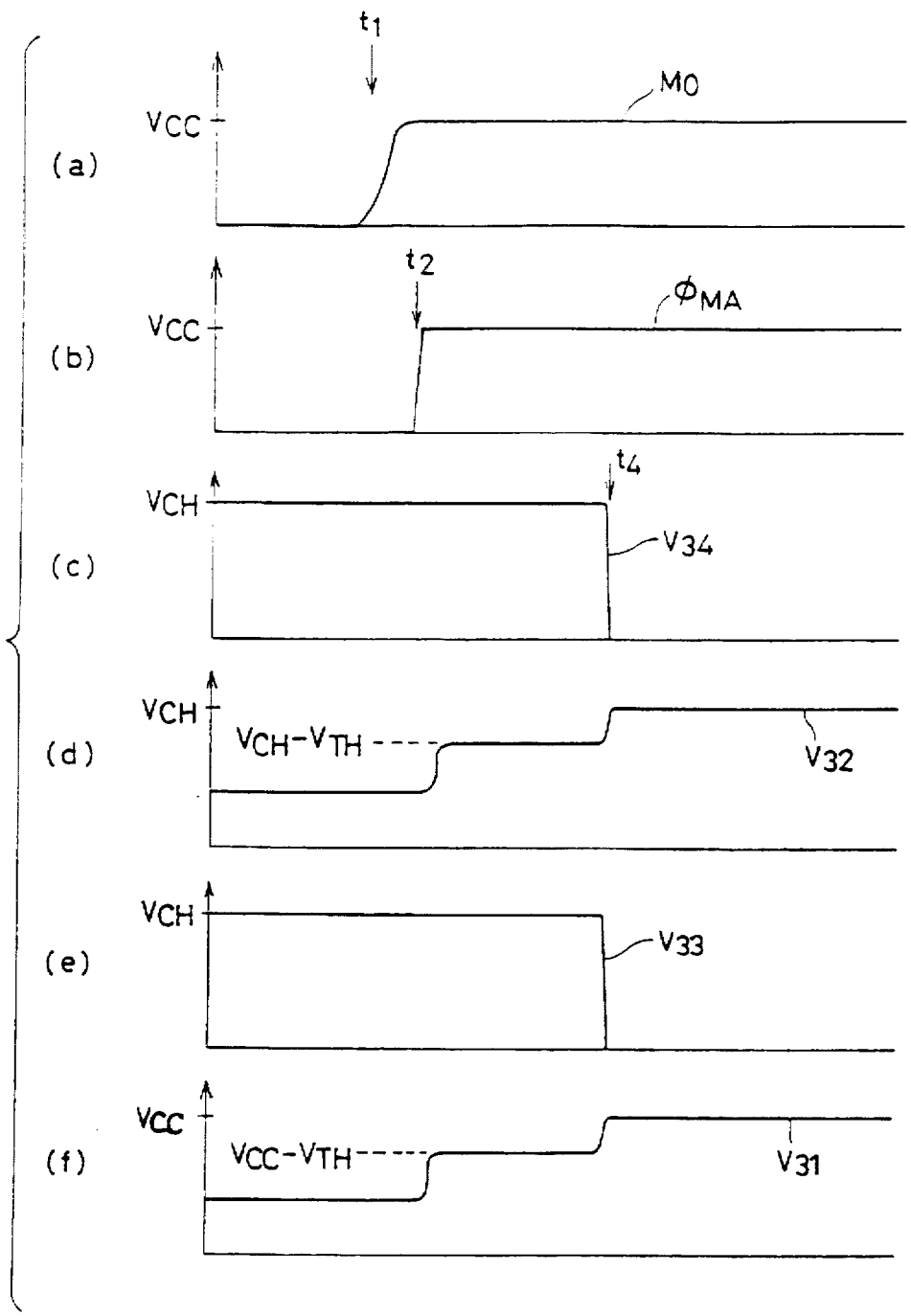
FIG. 22 is a timing chart of the case where a light load is connected to the output buffer circuit of FIG. 21.

FIG. 22 is a timing chart of the case where light load is connected to output buffer circuit 280 of FIG. 21. In this case, a signal /φ1 of low level is provided. Until time t4, voltages V33 and V34 of high level are provided to the gate electrodes of transistors 293 and 296, respectively, to turn off these transistors 293 and 296. Therefore, the gate voltage V31 of transistor 281 is charged to the level of VCC-$V_{TH}$ prior to time t4. The gate voltage V32 of transistor 282 is charged to the level of $V_{CH}$-$V_{TH}$ prior to time t4. After time t4, voltages V31 and V32 are charged to the levels of Vcc and $V_{CH}$, respectively.

Because the gate voltages V31 and V32 of transistors 281 and 282, respectively, are boosted with delay in the case of a light load, a current increasing at a rate lower than that of a heavy load can be provided to the load. As a result, generation of noise such as ringing can be prevented.

Figure 23:
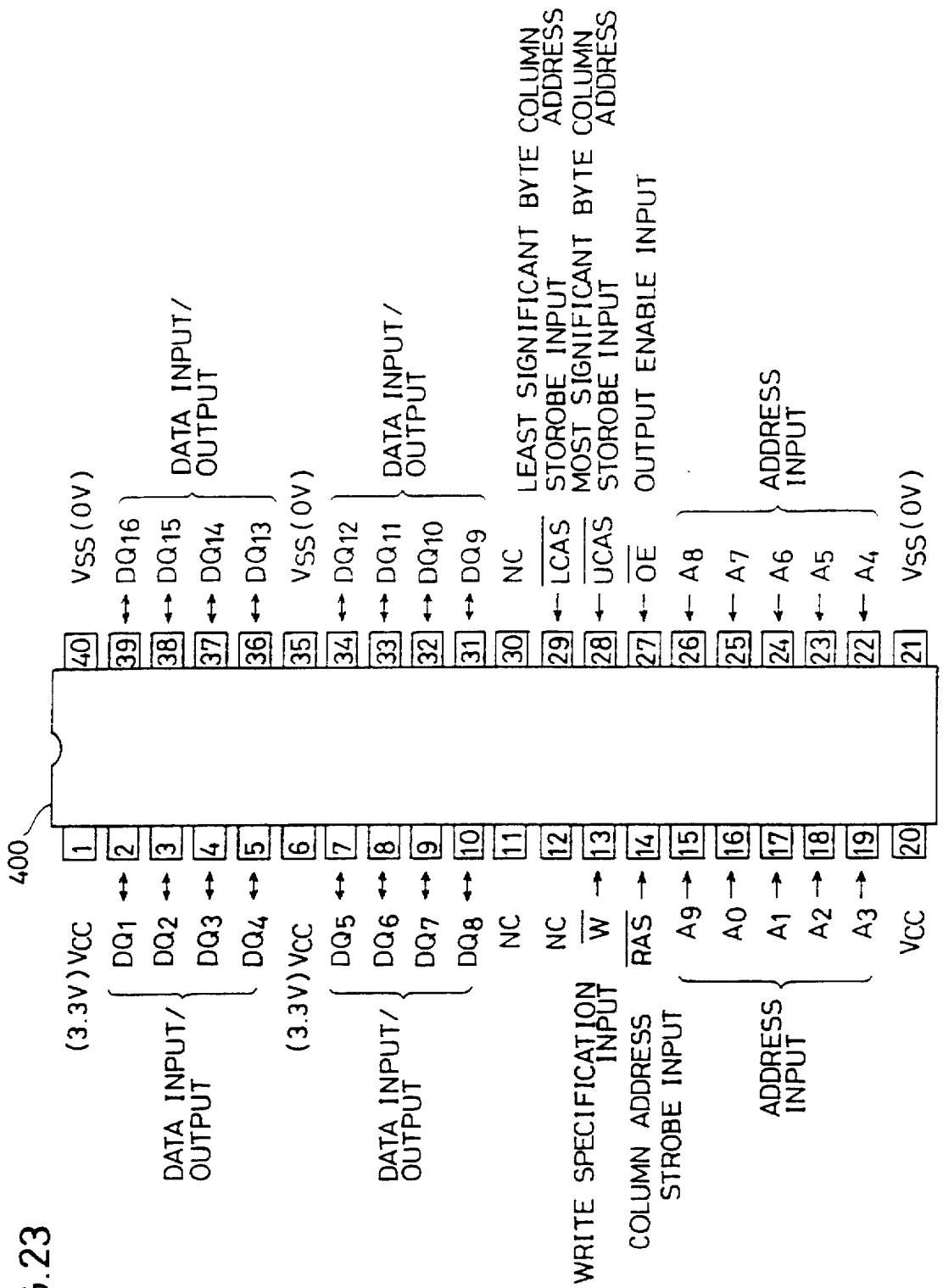
FIG. 23 is a terminal arrangement diagram of a DRAM having 16 data input/output terminals.

FIG. 23 is a terminal arrangement diagram of a DRAM having 16 data input/output terminals. Referring to FIG. 23, a DRAM 400 includes a total of sixteen data input/output terminals DQ1–DQ16.

Figure 24:
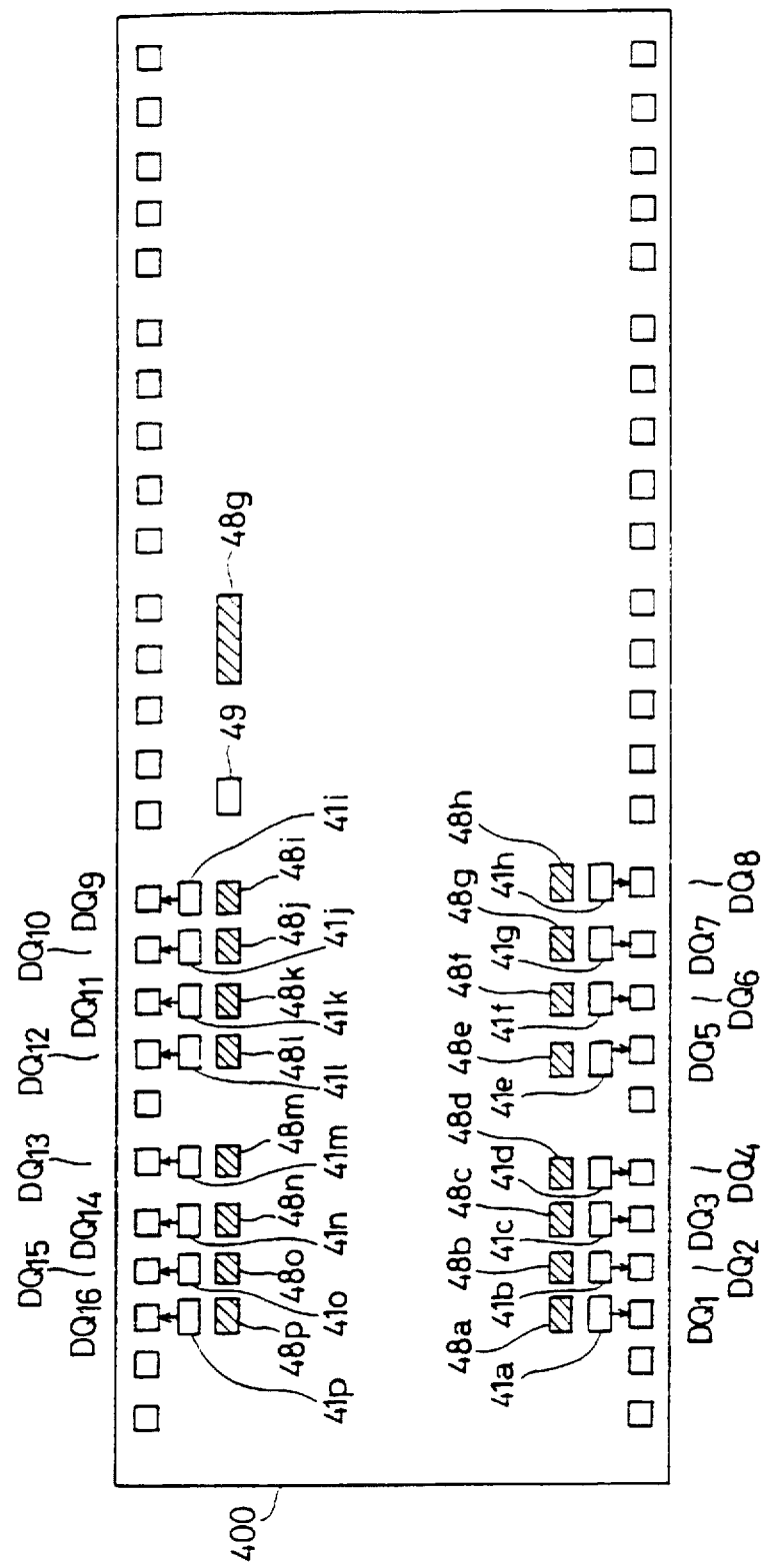
FIG. 24 schematically shows the arrangement of an output buffer circuit and a high voltage generator in the DRAM of FIG. 23.
Figure 25:
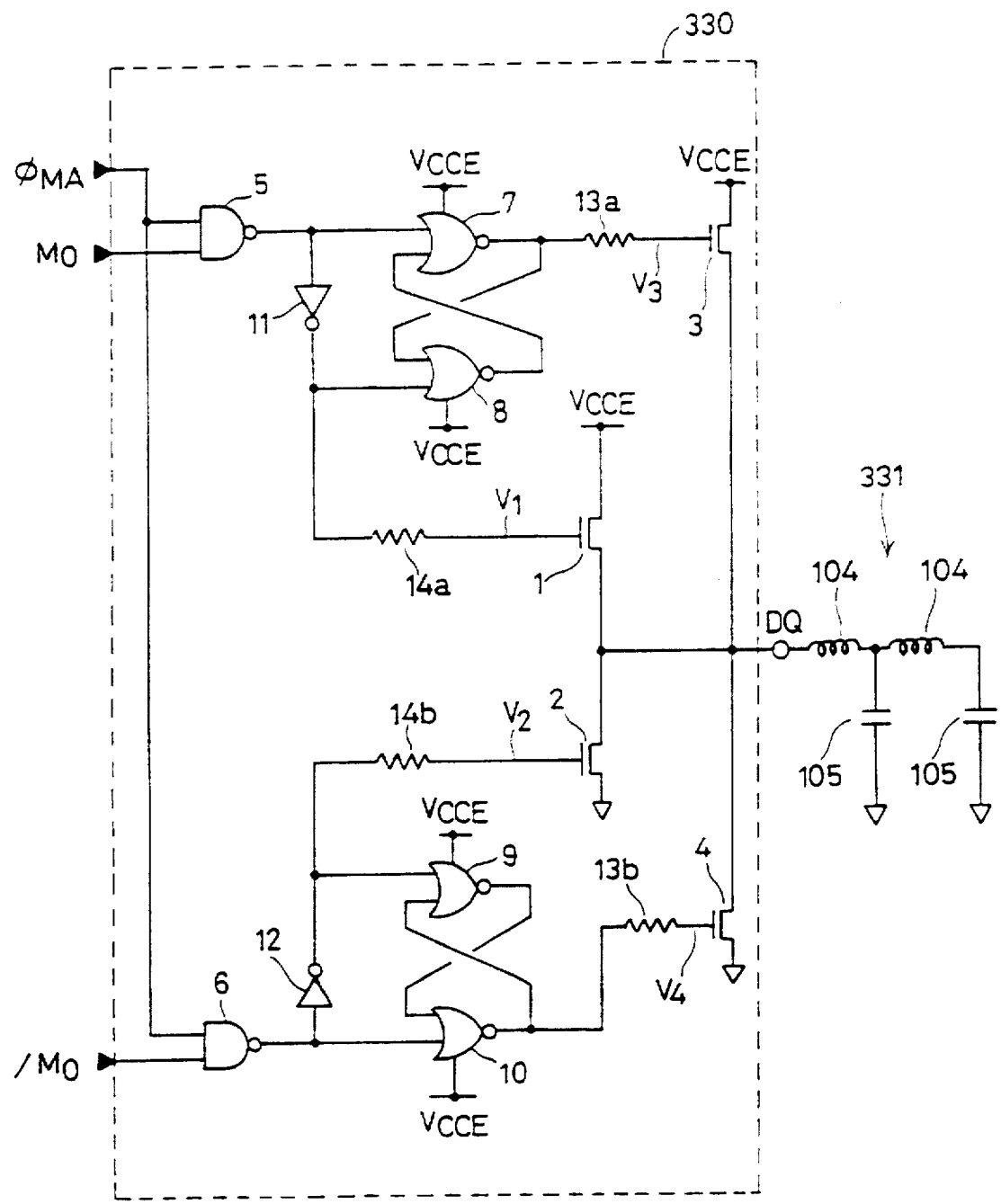
FIG. 25 is a circuit diagram of a conventional output buffer circuit.
Figure 26:
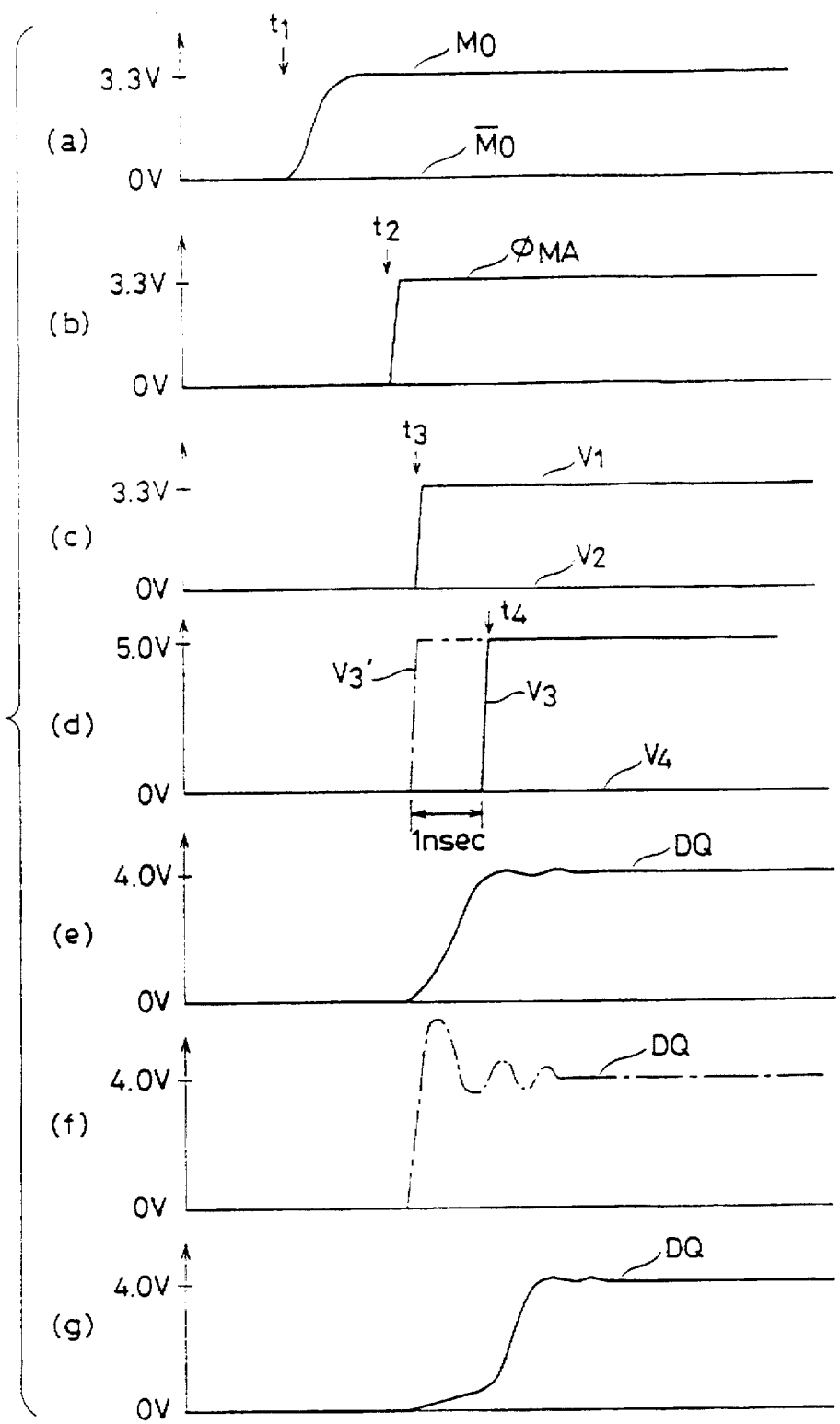
FIG. 26 is a timing chart for describing the operation of the circuit shown in FIG. 25.

FIG. 24 schematically shows an output buffer circuit and the arrangement of high voltage generators in DRAM 400 of FIG. 23. In FIG. 24, line 400 also indicates a semiconductor substrate. Referring to FIG. 24, output buffer circuits 41a–41p are provided for each of data input/output terminals DQ1–DQ16. Additionally, high voltage generators 48a–48p are provided for each output buffer circuit. DRAM 400 further includes a high voltage generator 48g for providing a high voltage to a row decoder or the like, and a burn-in test mode detecting circuit 49. In DRAM 400 shown in FIG. 24, the output buffer circuit described in the foregoing can be used.

Because a DRAM, i.e. a semiconductor integrated circuit device can be used for both heavy and light loads by bonding selection, it is not necessary to provide two manufacturing lines for two applications. In other words, a semiconductor chip can be used in common for either a heavy load or a light load. Because a high voltage generator is provided for each output buffer circuit to generate a high voltage in response to an applied data signal, an output signal of "H" can be provided under optimum power consumption. Furthermore, because the boosting level can be reduced in a high voltage generator during a burn-in test mode, damage of the internal circuit due to excessive high voltage can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An output driver circuit including a data output terminal and for providing an output data via said data output terminal, comprising:

a semiconductor substrate, a predetermined node formed in said substrate, current providing means formed in said substrate and responsive to an applied data signal defining said output data for providing an output current via said data output terminal, and current increasing rate control means formed in said substrate and responsive to a potential at said predetermined node for controlling an increasing rate of the output current by said current providing means, wherein said current providing means comprises a first field effect transistor connected between a first power supply potential and said data output terminal, and said current increasing rate control means comprises conductance increasing timing control means responsive to the potential at said predetermined node for controlling an increasing rate of a conductance of said first field effect transistor, and said current increasing rate control means controlling the output driver circuit to operate in at least a first state and a second state, said current providing means provides a first current increasing rate in the first state and said current providing means provides a second current increasing rate in the second state, said second current increasing rate being slower than said first current increasing rate.

2. The output driver circuit according to claim 1, wherein said current providing means further comprises a first switching element connected in parallel with said first field effect transistor between the first power supply potential and said data output terminal, and responsive to said applied data signal.

3. The output driver circuit according to claim 2, wherein said current increasing rate control means comprises delay means responsive to the potential at said predetermined node for delaying a conducting timing of said first field effect transistor.

4. The output driver circuit according to claim 3, wherein said first switching element comprises a second field effect transistor.

5. The output driver circuit according to claim 4, wherein said first field effect transistor has a mutual conductance smaller than that of said second field effect transistor.

6. The output drive circuit according to claim 1, wherein said conductance increasing rate control means comprises potential increasing rate control means responsive to the potential at said predetermined node for controlling an increasing rate of a potential of a gate electrode of said first field effect transistor.

7. The output driver circuit according to claim 1, wherein said current providing means comprises first charging means responsive to said applied data signal for charging a gate electrode of said first field effect transistor, wherein said conductance increasing rate control means comprises charge accelerating means responsive to the potential at said predetermined node for accelerating charging of the gate electrode of said first field effect transistor.

8. The output driver circuit according to claim 7, wherein said charge accelerating means comprises second charging means responsive to the potential at said predetermined node and said applied data signal for charging the gate electrode of said first field effect transistor.

9. The output driver circuit according to claim 1, wherein said current providing means comprises a plurality of switching elements connected in parallel between the first power supply potential and said data output terminal, and responsive to said applied data signal, wherein said current increasing rate control means comprises delay conducting means responsive to said potential at said predetermined node for conducting with delay at least one of said plurality of switching elements.

10. An output driver circuit including a data output terminal and for providing an output data via said data output terminal, comprising:

a semiconductor substrate, a predetermined node formed in said substrate, current providing means formed in said substrate and responsive to an applied data signal defining said output data for providing an output current via said data output terminal, current increasing rate control means formed in said substrate and responsive to a potential at said predetermined node for controlling the increasing rate of the output current by said current providing means, wherein said predetermined node comprises a bonding pad formed in said substrate, wiring means for selectively applying a power supply potential to said bonding pad, and potential detecting means formed in said substrate for detecting a potential at said bonding pad, wherein said current increasing rate control means responds to said potential detecting means for controlling the increasing rate of the output current of said current providing means.

11. An output driver circuit including a data output terminal and for providing an output data via said data output terminal, comprising:

a semiconductor substrate, a predetermined node formed in said substrate, current providing means formed in said substrate and responsive to an applied data signal defining said output data for providing an output current via said data output terminal, and current increasing rate control means formed in said substrate and responsive to a potential at said predetermined node for controlling an increasing rate of the output current by said current providing means, wherein said current providing means comprises first and second field effect transistors connected in parallel between a first power supply potential and said data output terminal, said first field effect transistor having a mutual conductance smaller than that of said second field effect transistor, and said current increasing rate control means comprises conductance increasing timing control means responsive to the potential at said predetermined node for controlling an increasing rate of a conductance of said first field effect transistor, and delay means responsive to the potential at said predetermined node for delaying a conduction timing of said second transistor.

* * * * *